(12) United States Patent
Sugimori

(10) Patent No.: US 6,774,464 B2
(45) Date of Patent: Aug. 10, 2004

(54) SEMICONDUCTOR DEVICE AND METHOD OF MANUFACTURING THE SAME

(75) Inventor: Shinya Sugimori, Kamiiso (JP)

(73) Assignees: Renesas Technology Corp., Tokyo (JP); Renesas Northern Japan Semiconductor, Inc., Hokkaido (JP)

(*) Notice: Subject to any disclaimer, the term of this patent is extended or adjusted under 35 U.S.C. 154(b) by 0 days.

(21) Appl. No.: 10/441,047

(22) Filed: May 20, 2003

(65) Prior Publication Data

US 2003/0227076 A1 Dec. 11, 2003

(30) Foreign Application Priority Data

Jun. 6, 2002 (JP) ............................... 2002-166156

(51) Int. Cl.[7] .................................. H01L 23/495
(52) U.S. Cl. ........................... 257/666; 257/676
(58) Field of Search .......................... 257/666, 676, 257/784

(56) References Cited

U.S. PATENT DOCUMENTS 6,072,228 A * 6/2000 Hinkle et al. ............... 257/666

2002/0125559 A1 * 9/2002 Mclellan ..................... 257/690

FOREIGN PATENT DOCUMENTS

JP 11-168169 6/1999

* cited by examiner

Primary Examiner—Roy Potter
(74) Attorney, Agent, or Firm—Miles & Stockbridge P.C.

(57) ABSTRACT

The present invention provides a semiconductor device and a manufacturing method thereof which can make a ground/power source potential stable without reducing the number of pins for signals. The semiconductor device includes a plurality of leads, a tab having a size smaller than a size of a semiconductor chip, suspending leads connected to the tab and having suspending lead exposing portions, four bar leads connected to the suspending leads and arranged outside the semiconductor chip, first wires for connecting pads of the semiconductor chip and the leads, second wires for connecting the pads of the semiconductor chip and the bar leads, and a sealing body for sealing the semiconductor chip using resin. On a back surface of the sealing body, a distance between the suspending lead exposing portion and the lead exposing portion is set to a value equal to or more than a distance between the lead exposing portions. Due to such a constitution, the suspending leads can be used as external terminals and hence, the ground and the power source potential can be made stable.

10 Claims, 22 Drawing Sheets

1b: TAB
4a: FIRST WIRE
4b: SECOND WIRE

3: SEALING MEMBER
5: QFN (SEMICONDUCTOR DEVICE)

3a: BACK SURFACE (MOUNTING SURFACE)

1i: LEAD EXPOSED PORTION (PARTIAL)
1l: SUSPENDED LEAD EXPOSED PORTION (PARTIAL)

1b: TAB
4a: FIRST WIRE
4b: SECOND WIRE

1: LEAD FRAME
1a: LEAD
1e: SUSPENDED LEAD
1f: BAR LEAD (COMMON LEAD PORTION)
1j: BENT PORTION

2: SEMICONDUCTOR CHIP
2a: PAD (ELECTRODE)
2b: MAIN SURFACE

9: MOLD FOR MOLDING
9a: UPPER MOLD (FIRST MOLD)
9b: LOWER MOLD (SECOND MOLD)

4c: THIRD WIRE

2d: DOUBLE-SIZED PAD (ELECTRODE)

2f: LOW-RESISTANT LINE (RELAY LINE)

1h: ISLAND (COMMON LEAD PORTION)

SEMICONDUCTOR DEVICE AND METHOD OF MANUFACTURING THE SAME

BACKGROUND OF THE INVENTION

The present invention relates to a semiconductor manufacturing technique, and more particularly to a technique which is effectively applicable to enhancement of electric characteristics of semiconductor devices.

With respect to a semiconductor package (semiconductor device), conventionally, a problem relating to reflow cracks has been known. As a method for solving such a problem, a small tab structure which sets a size of tabs (chip mounting portions) to a value smaller than a size of semiconductor chips has been proposed. As one example of the small tab structure, a QFP (Quad Flat Package) having a small tab structure has been known.

Further, with respect to the semiconductor package having a small tab structure, to enhance electric characteristics such as characteristics which can cope with high frequency, there exists a semiconductor package which is required to have stabilization of ground/power source potential. For example, such a technique is disclosed in Japanese Unexamined Patent Publication No. Hei. 11(1999)-168169.

Japanese Unexamined Patent Publication No. Hei. 11(1999)-168169 discloses a technique that in a QFP having a small tab structure, ground/power source connecting portions which are supported by tab suspending leads (suspending leads) are provided, and by connecting pads (electrodes) of the semiconductor chip with the ground/power source connecting portions using wires, restrictions imposed on a pad layout is eliminated and, at the same time, the stability of ground/power source potential is enhanced.

SUMMARY OF THE INVENTION

However, in the QFP, since the tab suspending leads are not exposed to a mounting surface of a sealing body, the tab suspending leads cannot be used as external terminals.

Accordingly, the use of outer leads is indispensable as ground/power source pins.

As a result, it is necessary to use some outer leads as the ground/power source pins out of a large number of outer leads thus giving rise to a problem that the number of pins for signals is decreased.

Recently, a tendency to use a large number of pins aiming at enhancement of functions of semiconductor package is increasing and hence, particularly with respect to the semiconductor package having large pins, the decrease of the number of pins for signals leads to a serious problem. Further, the stabilization of a ground/power source potential is also considered to be a serious task to be solved.

Accordingly, it is an object of the present invention to provide a semiconductor device and a manufacturing method thereof for achieving stabilization of a ground/power source potential without decreasing the number of pins for signals.

It is another object of the present invention to provide a semiconductor device and a manufacturing method thereof which can enhance electric characteristics thereof.

The above-mentioned objects and other objects and novel features of the present invention will become apparent from the description of this specification and attached drawings.

To describe the summary of typical inventions out of inventions disclosed in the present invention, they are as follows.

According to a first aspect of the present invention, there is provided a semiconductor device which includes a semiconductor chip which has a semiconductor die and a plurality of electrodes, a plurality of leads which are arranged around the semiconductor chip, a tab which has a size smaller than a size of a main surface of the semiconductor chip and is bonded to a back surface of the semiconductor chip, a plurality of suspending leads which are connected to the tab and to which bent portions are formed so as to form stepped portions with respect to the tab, common lead portions which are connected to the suspending leads and have at least portions thereof arranged outside the semiconductor chip, a plurality of first wires which electrically connect a plurality of electrodes of the semiconductor chip with a plurality of leads respectively, second wires which electrically connect electrodes of the semiconductor chip with the common lead portions, and a sealing body which seals the semiconductor chip, the first and the second wires, the tab and the common lead portion using resin, wherein a plurality of leads and a plurality of suspending leads have portions thereof exposed to a mounting surface of the sealing body, and a distance between a suspending lead exposing portion and a lead exposing portion disposed close to the suspending lead portion on the mounting surface is set to a value equal to or more than a distance between the neighboring lead exposing portions.

According to a second aspect of the present invention, there is provided a method for manufacturing a semiconductor including a step of preparing a lead frame including a tab which has a size smaller than a main surface of a semiconductor chip, a plurality of leads, a plurality of suspending leads which are connected to the tab and common lead portions which are connected to the suspending leads, a step of adhering the semiconductor chip on which a plurality of electrodes are formed and the tab using an adhesive material, a step of electrically connecting the electrodes of the semiconductor chip and the common lead portions of the lead frame corresponding to the electrodes of the semiconductor chip by second wires, a step of electrically connecting the electrodes of the semiconductor chip and the leads of the lead frame corresponding to the electrodes of the semiconductor chip by first wires, a step of sealing the semiconductor chip, the first and second wires, the tabs and the common lead portions using resin in a state that the plurality of suspending leads of the lead frame are sandwiched by a first mold and a second mold of a forming mold and in such a manner that portions of the respective plurality of leads and suspending leads are exposed on a mounting surface of a sealing body, and a step of separating the plurality of leads and suspending leads from the lead frame.

In the method for manufacturing the semiconductor device, wire bonding is performed such that a wire loop of the first wire is set higher than a wire loop of the second wire.

DETAILED DESCRIPTION OF PREFERRED EMBODIMENTS

In following embodiments, the explanation of the same or similar parts is omitted unless otherwise particularly necessary.

Further, in the embodiments described hereinafter, when it is necessary for the sake of convenience, the explanation is made by dividing the invention into a plurality of sections or a plurality of embodiments. However, unless otherwise specified particularly, these embodiments are not irrelevant to each other and there exists the relationship that one embodiment is a modification, a detailed explanation or a complementary explanation of a portion or the whole of other embodiment.

Further, in the embodiments described hereinafter, when the reference is made with respect to the number and the like (including number, numerical values, quantity, range and the like) of elements, unless otherwise specified and unless otherwise the number and the like of elements are definitely limited to the specific number in principle, the number and the like are not limited to such specific number and may be a number above or below the specific number.

Further, in the embodiment described hereinafter, it is needless to say that the constituent elements (including element steps and the like) are not always indispensable unless otherwise specified or unless they are considered indefinitely indispensable in principle.

In the same manner, in the embodiments described hereinafter, when the reference is made with respect to the shape, the positional relationship and the like of the constituent elements, unless otherwise specified or unless it is indefinitely considered unreasonable, these shapes and positional relationship substantially include those which approximate or are similar to these shapes. The same goes for the above-mentioned numerical values and ranges.

Further, in all drawings which are served for explaining the embodiments of the present invention, the constitutional elements which have the same functions are given same symbols and the repeated explanation thereof is omitted.

(Embodiment 1)

Figure 1:
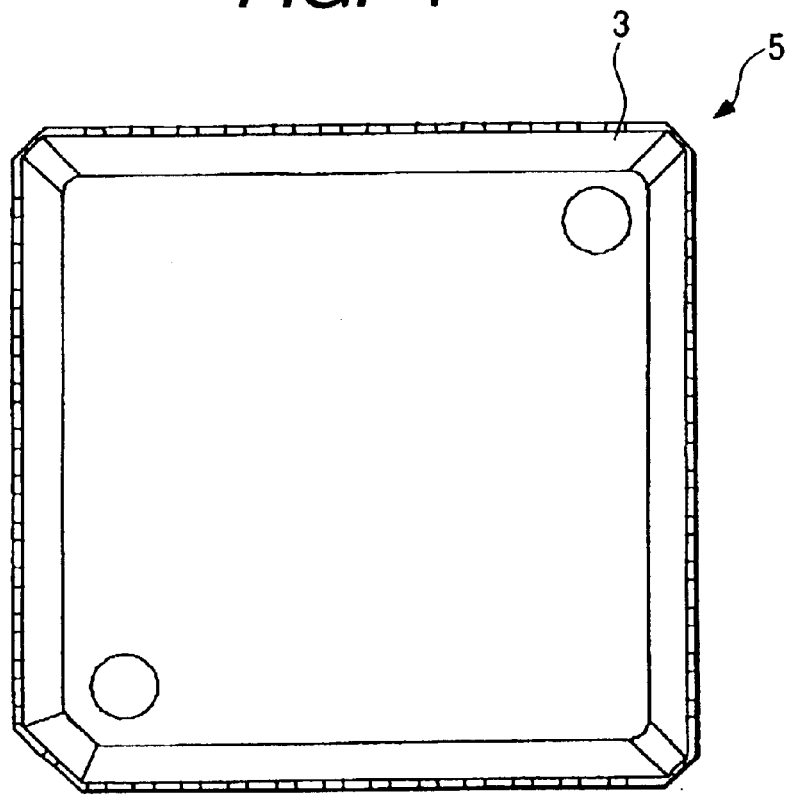
FIG. 1 is a plan view showing one example of a structure of a semiconductor device (QFN) of an embodiment 1 of the present invention.
Figure 2:
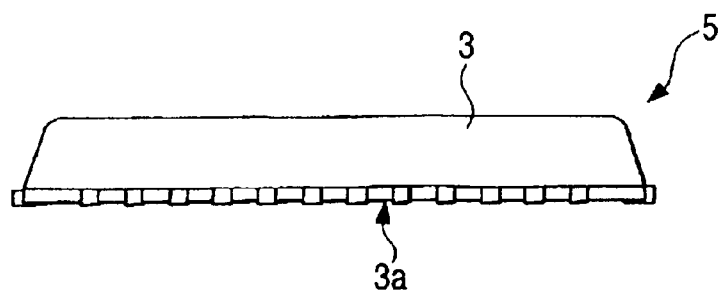
FIG. 2 is a side view showing one example of the structure of the QFN shown in FIG. 1.
Figure 3:
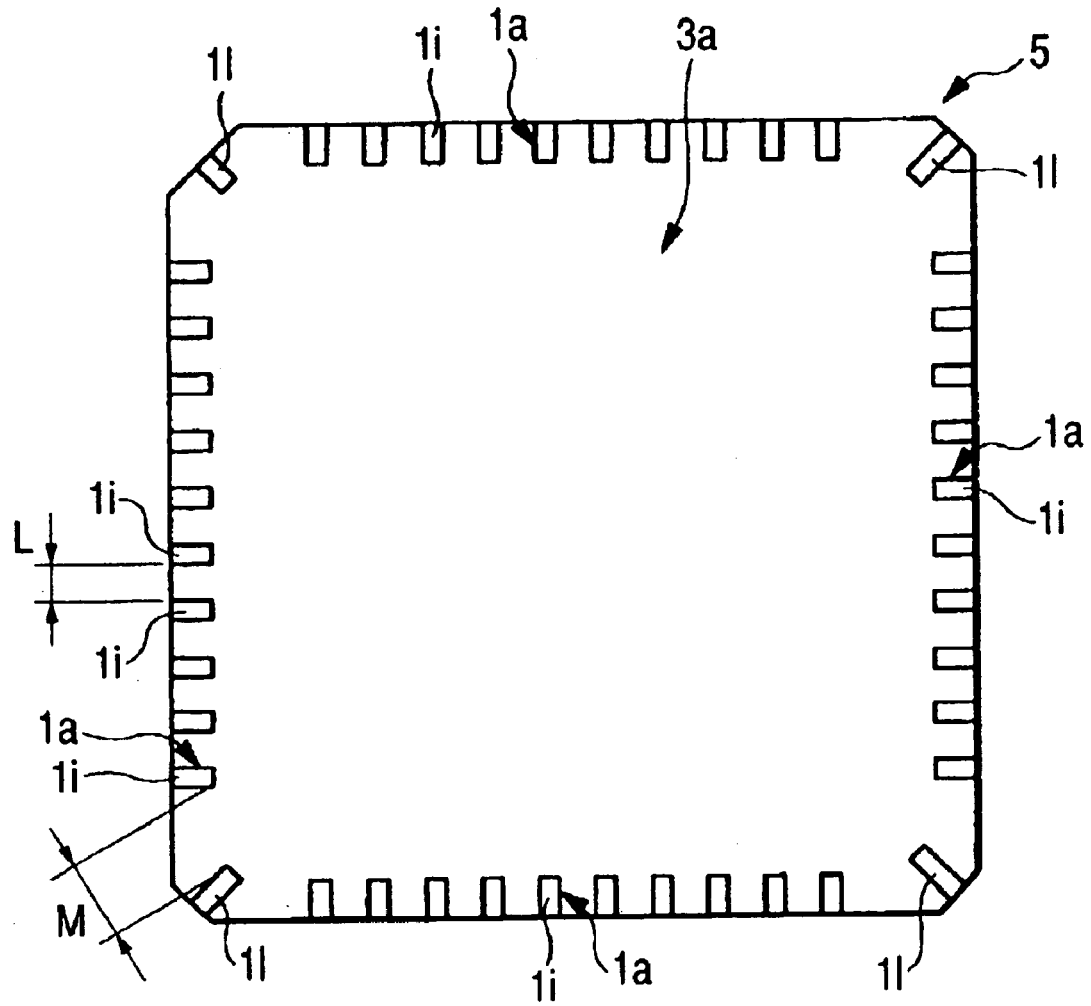
FIG. 3 is a bottom view showing one example of the structure of the QFN shown in FIG. 1.
Figure 4:
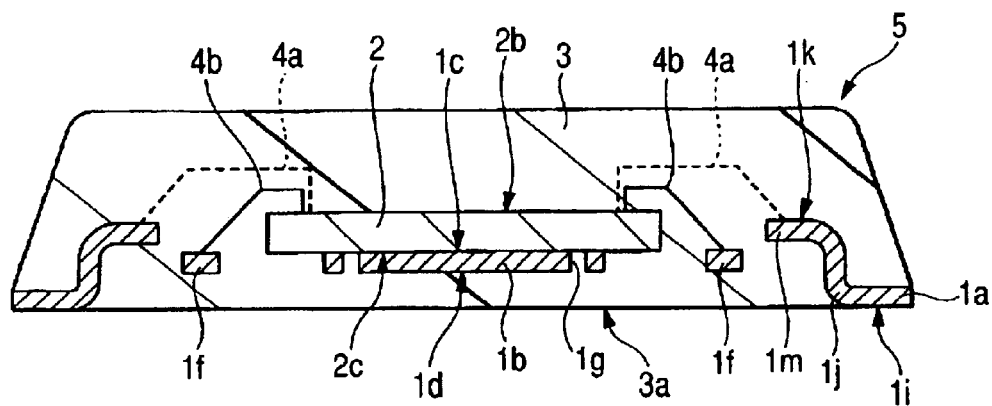
FIG. 4 is a cross-sectional view showing one example of the structure of a cross-section of the QFN shown in FIG. 1 taken along a line A—A shown in FIG. 8.
Figure 5:
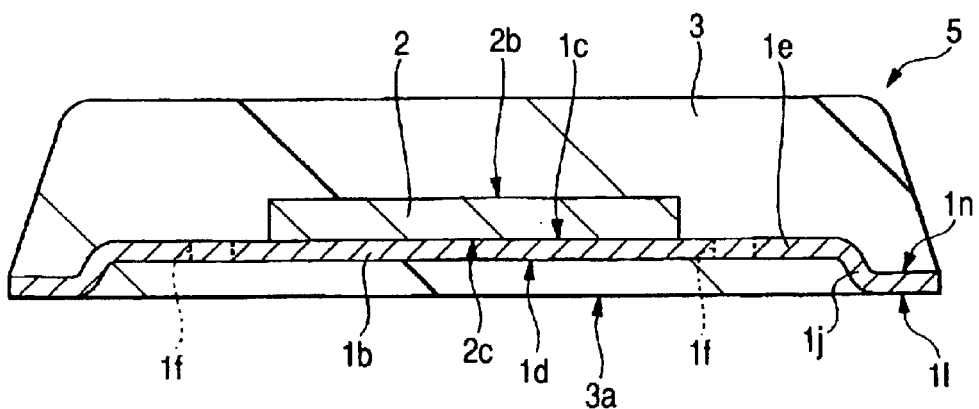
FIG. 5 is a cross-sectional view showing one example of the structure of a cross-section of the QFN shown in FIG. 1 taken along a line B—B shown in FIG. 8.
Figure 6:
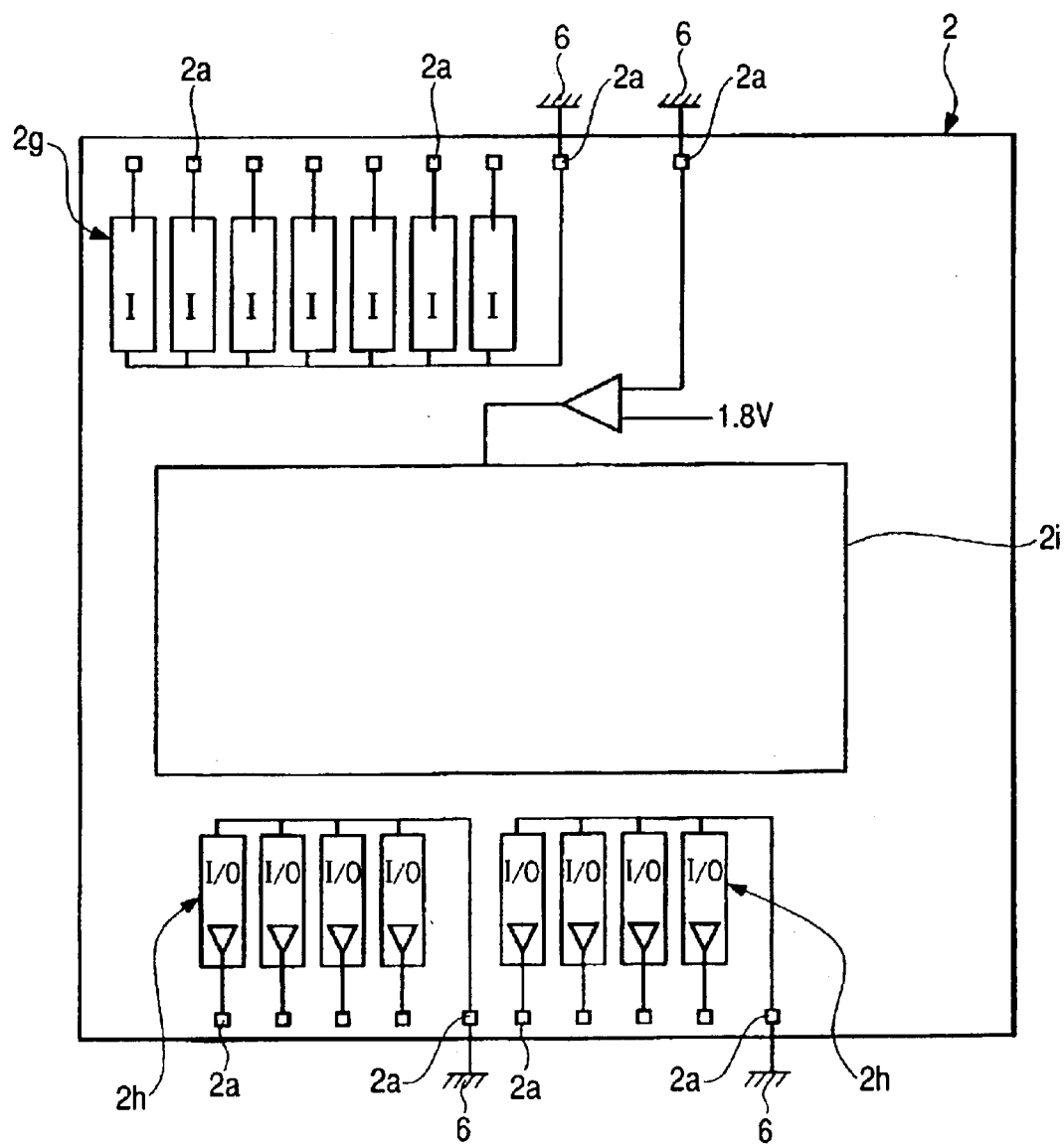
FIG. 6 is a circuit block diagram showing one example of the constitution of a circuit of a logic chip incorporated into the QFN shown in FIG. 1.
Figure 7:
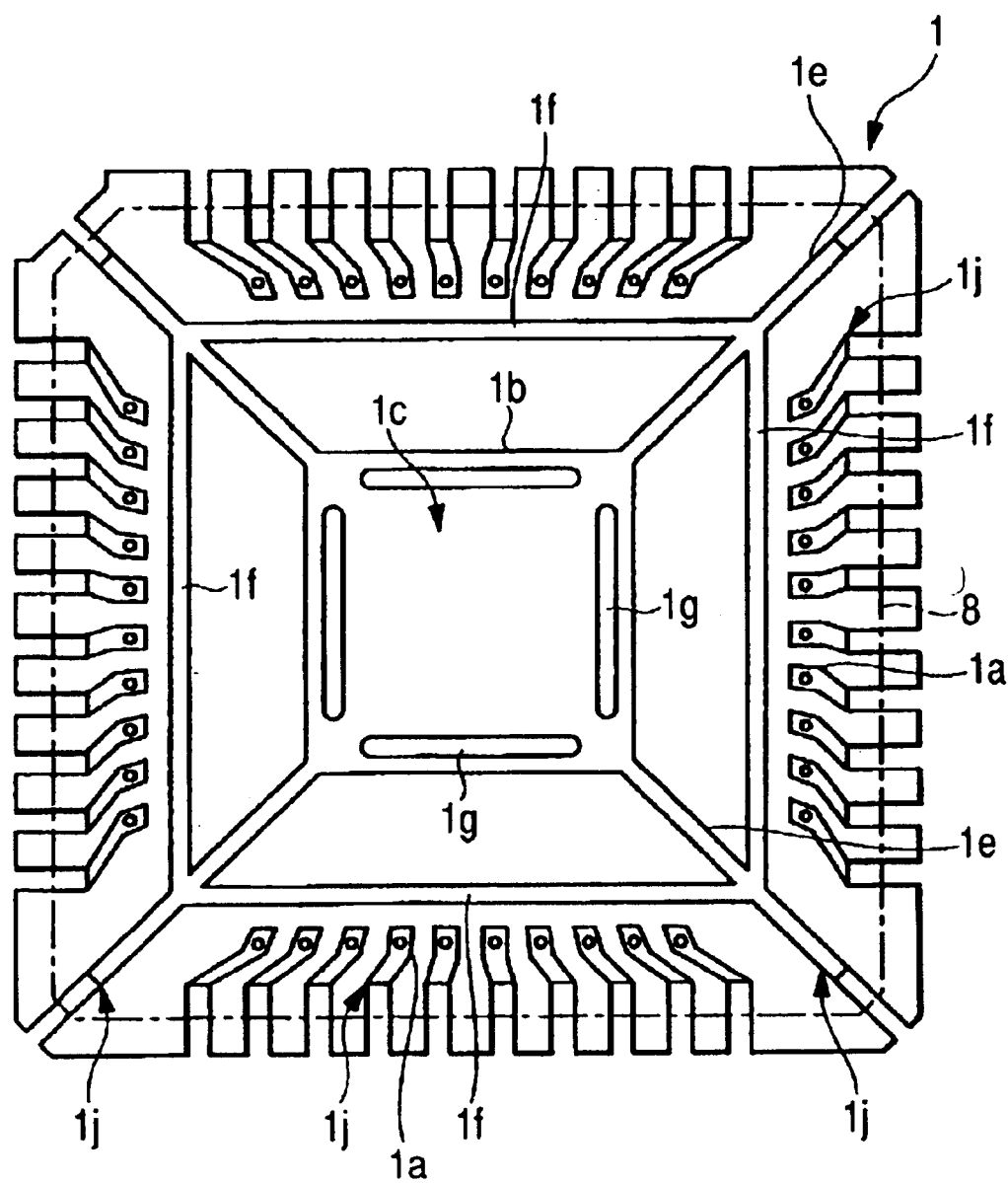
FIG. 7 is a partial plan view showing one example of the structure of a lead frame served for assembling of the QFN shown in FIG. 1.
Figure 8:
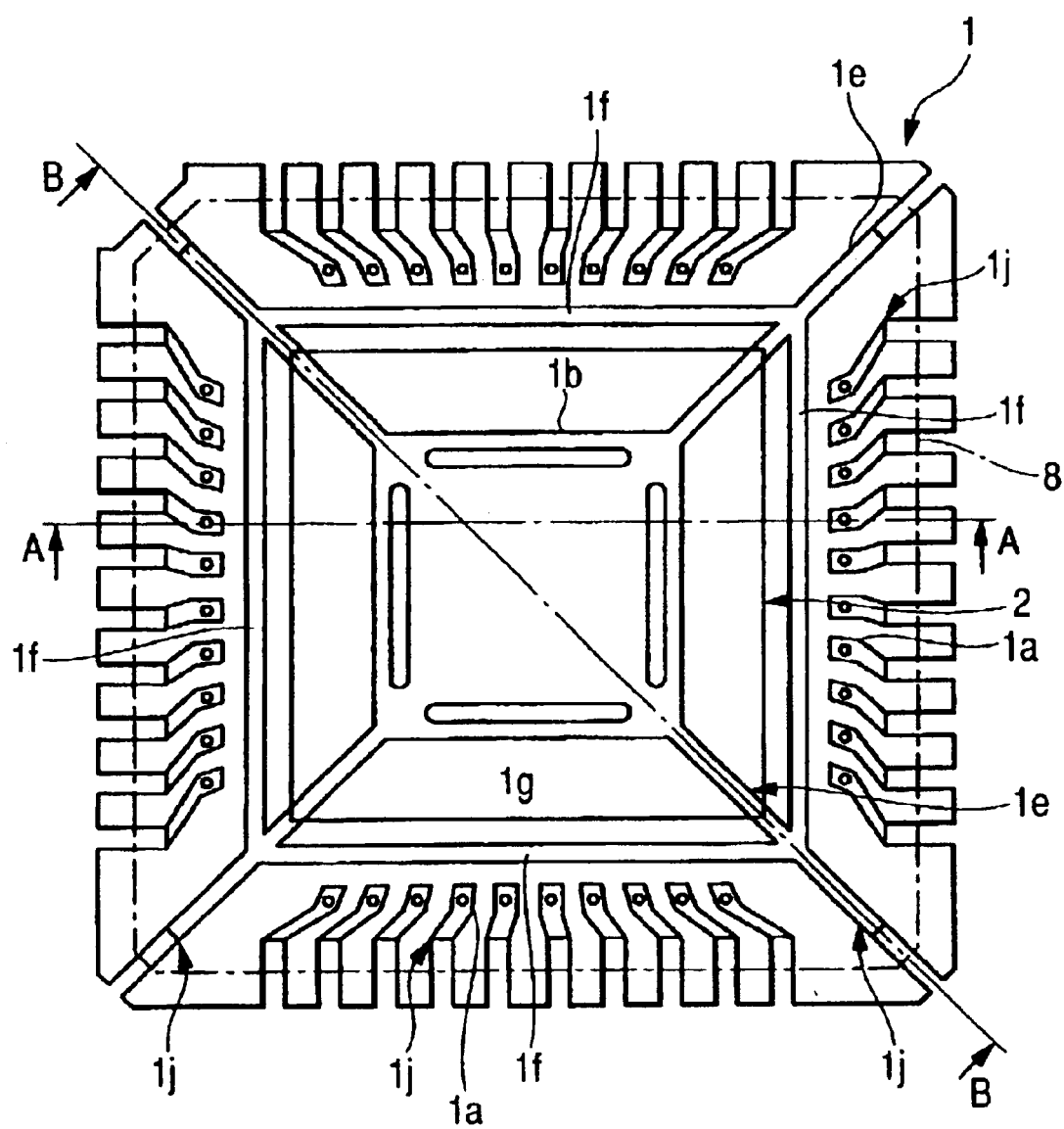
FIG. 8 is a partial plan view showing one example of the structure of the QFN shown in FIG. 1 after die bonding in assembling of the QFN.
Figure 9:
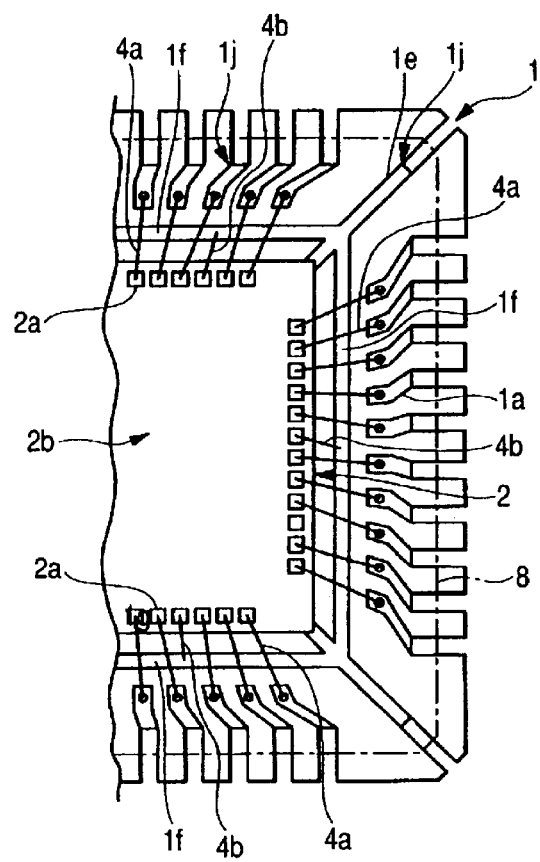
FIG. 9 is a partial plan view showing one example of the structure of the QFN shown in FIG. 1 after wire bonding in assembling of the QFN.
Figure 10:
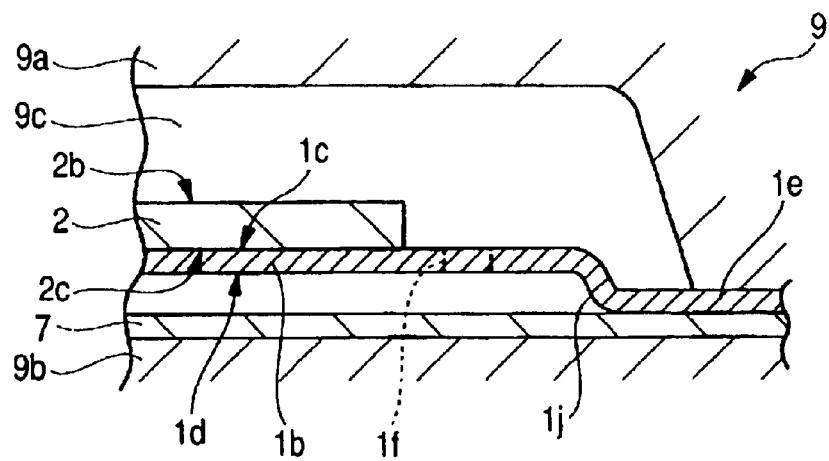
FIG. 10 is a partial cross-sectional view showing one example of a mold clamping structure at the time of performing resin molding in assembling of the QFN shown in FIG. 1.
Figure 11:
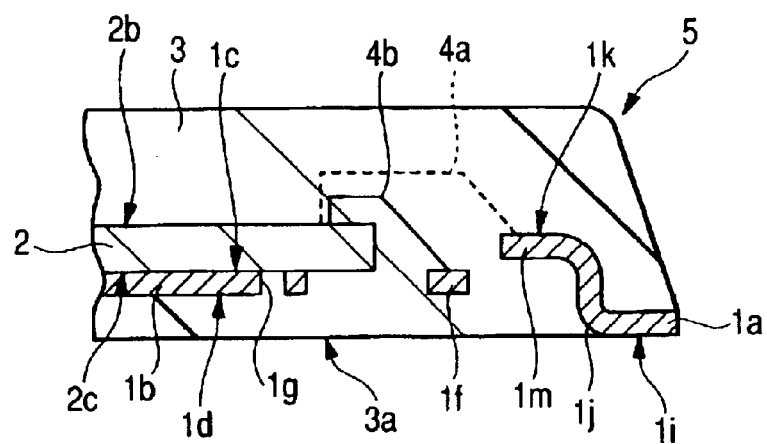
FIG. 11 is a partial cross-sectional view showing one example of the structure of the QFN shown in FIG. 1 after cutting leads.
Figure 12:
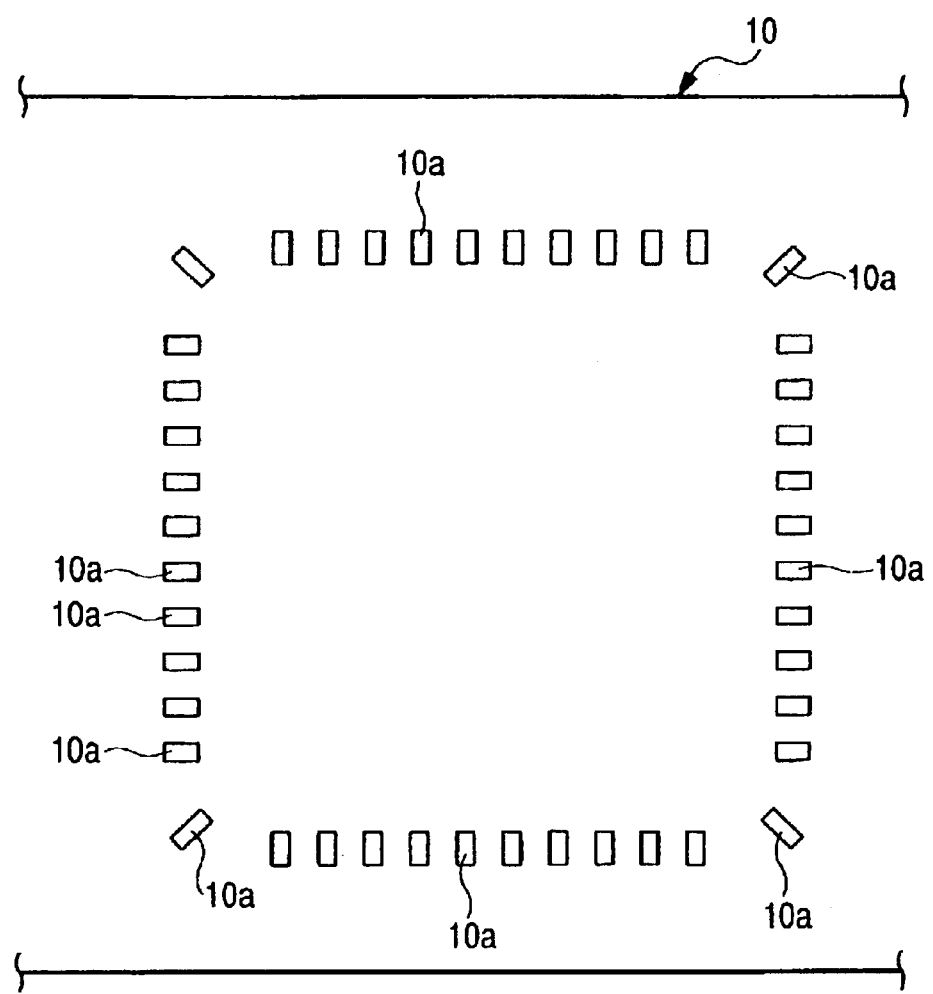
FIG. 12 is a partial plan view showing one example of a terminal arrangement of a mounting substrate on which the QFN shown in FIG. 1 is mounted.
Figure 13:
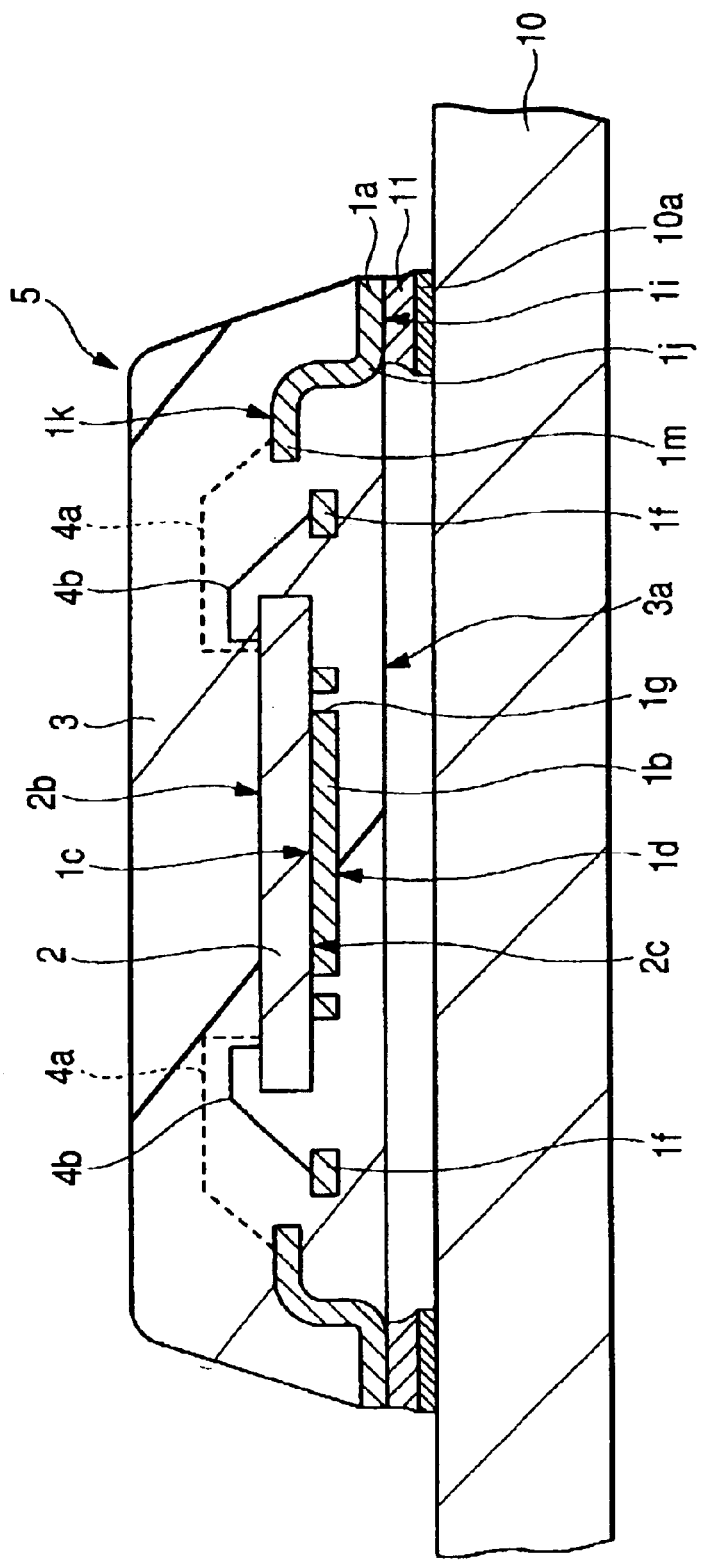
FIG. 13 is a partial cross-sectional view showing one example of the mounting structure in which the QFN shown in FIG. 1 are mounted on the mounting substrate by cutting the mounting structure at a lead position.
Figure 14:
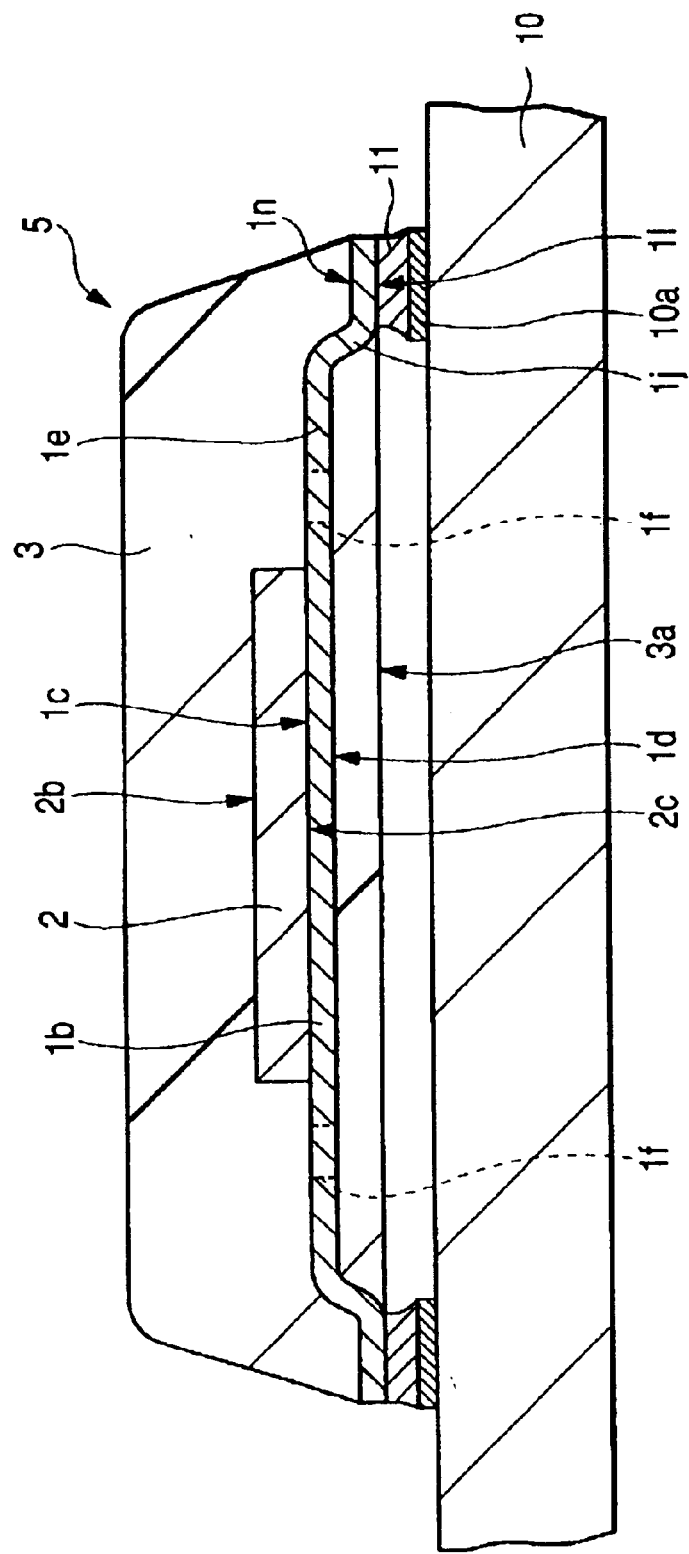
FIG. 14 is a partial cross-sectional view showing one example of the mounting structure in which the QFN shown in FIG. 1 are mounted on the mounting substrate by cutting the mounting structure at a lead position.

FIG. 1 is a plan view showing one example of a structure of a semiconductor device (QFN) of the embodiment 1 of the present invention. FIG. 2 is a side view showing one example of the structure of the QFN shown in FIG. 1. FIG. 3 is a bottom view showing one example of the structure of the QFN shown in FIG. 1. FIG. 4 is a cross-sectional view showing one example of the structure of a cross-section of the QFN shown in FIG. 1 taken along a line A—A shown in FIG. 8. FIG. 5 is a cross-sectional view showing one example of the structure of a cross-section of the QFN shown in FIG. 1 taken along a line B—B shown in FIG. 8. FIG. 6 is a circuit block diagram showing one example of the constitution of a circuit of a logic chip incorporated into the QFN shown in FIG. 1. FIG. 7 is a partial plan view showing one example of the structure of a lead frame served for assembling of the QFN shown in FIG. 1. FIG. 8 is a partial plan view showing one example of the structure of the QFN shown in FIG. 1 after die bonding in assembling of the QFN. FIG. 9 is a partial plan view showing one example of the structure of the QFN shown in FIG. 1 after wire bonding in assembling of the QFN. FIG. 10 is a partial cross-sectional view showing one example of a mold clamping structure at the time of performing resin molding in assembling of the QFN shown in FIG. 1. FIG. 11 is a partial cross-sectional view showing one example of the structure of the QFN shown in FIG. 1 after cutting leads. FIG. 12 is a partial plan view showing one example of a terminal arrangement of a mounting substrate on which the QFN shown in FIG. 1 are mounted. FIG. 13 is a partial cross-sectional view showing one example of the mounting structure in which the QFN shown in FIG. 1 are mounted on the mounting substrate by cutting the mounting structure at a lead position. FIG. 14 is a partial cross-sectional view showing one example of the mounting structure in which the QFN shown in FIG. 1 are mounted on the mounting substrate by cutting the mounting structure at a lead position.

The semiconductor device of the embodiment 1 is a miniaturized, thin, resin-sealed and non-lead type semiconductor package. Here, the explanation is made by taking a QFN 5 as an example of the semiconductor device.

Further, as shown in FIG. 3, in the QFN 5, portions of leads 1a which constitute a plurality of external terminals are formed as lead exposing portions 1i, wherein the lead exposing portions 1i are arranged in parallel on a peripheral portion of a mounting surface (hereinafter, this surface being referred to as a back surface 3a) of a sealing body 3 formed by resin molding in an exposed manner. Each lead 1a performs both functions as an inner lead embedded in the sealing body 3 and an outer lead exposed on the back surface 3a of the sealing body 3.

Further, a tab 1b on which a semiconductor chip 2 is mounted has a structure in which the tab 1b has a size smaller than a size of a main surface 2b of the semiconductor chip 2 so that the tab 1b is embedded into the inside of the sealing body 3 and is not exposed.

That is, the QFN 5 of this embodiment 1 is a semiconductor package having a tab embedded structure which embeds a small tab therein. Further, portions of suspending leads 1e which support four corner portions of the tab 1b are exposed at four corner portions of the back surface 3a of the sealing body 3 as suspending lead exposing portions 11 and these suspending lead exposing portions 11 are utilized as external terminals.

To explain the detailed constitution of the QFN 5 shown in FIG. 1 to FIG. 5, the QFN 5 includes the semiconductor chip 2 which has a plurality of semiconductor dies and a plurality of bonding pads (electrodes) 2a which are formed on a main surface of the semiconductor substrate, a plurality of leads 1a which are arranged around the semiconductor chip 2, the tab 1b which has a size smaller than a size of a main surface 2b of the semiconductor chip 2 and is bonded to a back surface 2c of the semiconductor chip 2 by way of a die bonding material, four suspending leads 1e which are connected to the tab 1b and to which bent portions 1j are formed so as to form stepped portions with respect to the tab 1b, bar leads 1f forming four common lead portions which are connected to the suspending leads 1e and are arranged outside the semiconductor chip 2, first wires 4a which electrically connect a plurality of pads 2a of the semiconductor chip 2 with a plurality of leads 1a respectively, second wires 4b which electrically connect the pads 2a of the semiconductor chip 2 with the bar leads 1f, and the sealing body 3 which seals the semiconductor chip 2, the first and the second wires 4a, 4b, the tab 1b and the bar leads 1f using resin.

Further, a plurality of leads 1a and four suspending leads 1e have respective portions thereof exposed to back surface 3a of the sealing body 3 as shown in FIG. 3. Here, a distance (M) between a suspending lead exposing portion 11 which constitutes an exposing portion of the suspending lead 1e and a lead exposing portion 1i which constitutes an exposing portion of the lead 1a disposed close to the suspending lead exposing portion 11 on the mounting surface is set to a value equal to or more than a distance (L) between the neighboring lead exposing portions 1i.

That is, to utilize the suspending lead exposing portions 11 as external terminals such as ground terminals or the like, it is necessary to ensure the sufficient distance (M) between the suspending lead exposing portion 11 and the lead 1a disposed close to the suspending lead exposing portion 11 in view of the relationship of connection between the substrate-side terminals 10a (see FIG. 12) with these leads 1a, wherein the distance (M) is set to satisfy the relationship "distance (M)≧distance (L) on the back surface 3a of the sealing body.

Accordingly, in the mounting substrate 10 shown in FIG. 12 on which the QFN 5 of the first embodiment is mounted, with respect to the substrate-side terminals 10a which are provided corresponding to the terminal arrangement of the QFN 5, the substrate-side terminals 10a are formed at four corners of the mounting substrate 10.

Accordingly, as shown in FIG. 13 and FIG. 14, the QFN 5 of this embodiment can use the suspending leads 1e as external terminals and can connect by soldering the suspending leads 1e to the substrate-side terminals 10a of the mounting substrate 10 together with respective leads 1a by way of the solder connection portions 11 at the time of mounting the QFN 5 to the mounting substrate 10.

That is, by setting a pitch between the suspending lead exposing portion 11 and the lead exposing portion 1i to a value equal to or larger than a pitch between the leads 1a, it is possible to use the suspending leads 1e as the external terminals.

In the QFN 5 of this embodiment, the number of leads 1a along one side is 10 pieces except for the suspending leads 1e at the corner portions. However, the number of leads 1a is not limited to 10 pieces.

Further, the QFN 5 of this embodiment 1 is provided for strengthening a ground and a power source to cope with high frequency in the semiconductor package having a small tab structure. Here, with the use of the small tab structure, it is difficult to directly connect the ground of the semiconductor chip 2 and the pad 2a of the power source with the tab 1b by wires (such a wire connection being referred to as "down bonding") and hence, bar leads 1f which are connected with the suspending leads 1e are arranged outside the semiconductor chip 2, the bar leads 1f and the grounds of the semiconductor chip 2 and the pad 2a of the power source are connected to each other by wires and, at the same time, four suspending leads 1e which assume the same potential as the ground and the power source are electrically connected to the mounting substrate 10 as the external terminals at the time of performing the package mounting whereby it is possible to strengthen the ground and the power source.

That is, the bar leads 1f constitute the common lead portions for down bonding.

Here, FIG. 6 shows one example of the block constitution of a circuit of a logic chip. Although a small current flows at the time of supplying a power source to an input part 2g and a logic circuit 2i in general, there may be a case in which buffer circuits are formed in output parts 2h and a large current flows. In such a case, to use the ground and the power source line in common using the wiring in the chip, the resistance of the wiring cannot be ignored and hence, there is a possibility that potentials of respective circuits assume an unstable state and the operational characteristics become defective.

Accordingly, as shown in FIG. 6, the connection of the output parts 2h to the ground terminals 6 is divided into a plurality of sections (for example, every four I/O pins) or the connection of the input parts 2g and the logic circuit 2i to the ground terminals 6 is independently performed and a plurality of pads 2a for ground and power source are pulled out and the ground connection is performed on the lead frame so that the ground potential can be used in common whereby the ground and the power source can be made stable.

Accordingly, in the QFN 5 having a small tab structure of this embodiment 1, for example, in mounting the logic chip shown in FIG. 6, by connecting a plurality of pads 2a for ground and power source of the semiconductor chip 2 using the bar leads If and second wires 4b, the tab 1b, the suspending leads 1e and the bar leads 1f are allowed to have the ground potential in common.

Further, in mounting the semiconductor chip 2 on the mounting substrate 10, it is possible to use the suspending leads 1e as external terminals and to connect the suspending leads 1e to the substrate-side terminals 10a of the mounting substrate 10 by soldering and hence, it is possible to use the suspending lead 1e as the ground terminals and to perform the ground connection with the mounting substrate 10 through these ground terminals whereby the ground and the power source of the QFN 5 having a small tab structure can be made stable.

Further, since it is possible to use the suspending leads 1e as the external terminals, the ground and the power source potential can be made stable without decreasing the number of pins for signals. This leads to the reduction of terminals for ground and power source and hence, the number of external terminals can be decreased. This advantageous effect is outstanding particularly in the QFN 5 having a large number of pins.

Further, since it is possible to stabilize the ground and the power source potential in the QFN 5 having a small tab structure, the electric characteristics of the QFN 5 can be enhanced.

Here, in the QFN 5 of this embodiment 1, as shown in FIG. 7, each bar lead 1f which constitutes the common lead portion extends between the neighboring suspending leads 1e like a bridge and connects these suspending leads 1e out of 4 suspending leads 1e in a region defined between the tab 1b and the row of leads. Due to such a constitution, each bar lead 1f is arranged between the semiconductor chip 2 and the row of leads 1a and is disposed substantially parallel to the row of leads 1a and one side of the semiconductor chip 2.

Accordingly, as shown in FIG. 4 and FIG. 9, the ground of the semiconductor chip 2 and the pads 2a of the power source can be electrically connected with the bar leads 1f using the second wires 4b.

In this case, since four bar leads 1f respectively extend like a bridge along corresponding respective sides of the semiconductor chip 2 and hence, the necessary number of grounds and the wires for power source can be connected from any position at four sides of the semiconductor chip 2 in an arbitrary direction so that the grounds and the pads 2a for power source can be arranged at any portions such as corner portions or center portions of the row of pads at the time of designing the layout of pads in chip designing whereby the degree of arrangement of the grounds and the power source pads can be enhanced.

Further, in the QFN 5 of this embodiment 1, as shown in FIG. 4, the bar leads 1f are arranged at the same height as the tab 1b, while wire bonding portions 1m of the leads 1a are arranged at position further from the back surface 3a of the sealing body 3 than the bar leads 1f.

That is, each lead 1a includes the lead exposing portion 1i which is exposed to the back surface 3a of the sealing body 3 and is provided with a bent portion 1j which is formed by bending the lead 1a in the upward direction (direction away from the back surface 3a of the sealing body 3). Due to such a constitution, the wire bonding portion 1m of each lead 1a can be arranged at the position higher than that of the bar lead 1f.

As a result, when the wire bonding is performed, as shown in FIG. 4, it is possible to provide the difference in a loop height between the first wires 4a and the second wires 4b.

Due to such a constitution, it is possible to prevent short-circuiting between the first wire 4a and the second wire 4b. When the QFN 5 has a large number of pins and the pitch between the pads 2a is a fine pitch (narrow pad pitch), it is extremely advantageous to provide the difference in loop height.

Further, since the wire bonding portions 1m of the respective leads 1a are arranged at the position higher than that of the bar leads 1f, when the relatively large semiconductor chip 2 is mounted, it is unnecessary to press down the first wires 4a to a low position and hence, the first wires 4a can be easily bonded.

Here, the bar leads 1f are at the same height as the tab 1b and hence, the respective leads 1a are arranged at a position higher than that of the tab 1b.

Further, the QFN 5 adopts the tab embedded structure in which the tab 1b is embedded in the inside of the sealing body 3. That is, as shown in FIG. 5, the bent portion 1j which is formed by bending to raise the tab 1b is also formed on the suspending leads 1e and hence, stepped portions are formed between a chip supporting surface 1c of the tab 1b and a stepped surface 1n of each lead 1e contiguous to the chip supporting surface 1c. Due to such a constitution, sealing resin turns around the tab 1b and reaches a back surface 1d side of the tab 1b at the time of performing resin molding and hence, the tab 1b is embedded in the inside of the sealing body 3.

As shown in FIG. 4 and FIG. 5, a bending amount of the bent portion 1j of the lead 1a is larger than a bending amount of the bent portion 1j of the suspending lead 1e and hence, the respective leads 1a are arranged at a position higher than those of the tab 1b, the bar leads 1f and the suspending leads 1e.

Further, as shown in FIG. 7, slit-like notched portions 1g are formed in the tab 1b substantially along peripheral portions at four sides thereof. By filling sealing resin in the inside of the notched portions 1g at the time of performing resin molding, a bonding force between the sealing resin and the tab 1b can be enhanced.

The semiconductor chip 2 is fixed to the chip support surface 1c of the tab 1b by way of a die bonding material such as an adhesive material.

Further, the first wires 4a and the second wires 4b are formed of gold lines or the like, for example.

Further, the sealing body 3 is formed by resin sealing using a molding method, wherein the sealing resin used for forming the sealing body 3 is thermosetting epoxy resin or the like, for example.

Further, on the lead exposing portions 1i of the respective leads 1a which are exposed on the peripheral portions of the back surface 3a of the sealing body 3, solder plating layers for solder connection at the time of package mounting are formed.

Here, in place of the solder plating layers, palladium (Pd) plating layers or the like may be formed.

Next, the manufacturing method of the QFN 5 according to this embodiment 1 is explained.

First of all, the lead frame 1 shown in FIG. 7 which includes the tab 1b having a size smaller than a size of the main surface 2b of the semiconductor chip 2 to be mounted, a plurality of leads 1a which are arranged around the tab 1b, four suspending leads 1e which are connected to the tab 1b and the bar leads 1f which constitute common lead portions connected to the suspending leads 1e is prepared.

Here, the lead frame 1 has the tab-raised structure. That is, the tab-raised structure is formed by providing the bent portions 1j to the suspending leads 1e which support the tab 1b.

Further, the respective leads 1a are also provided with the bent portions 1j, wherein the height of the wire bonding portions 1m of respective leads 1a is set at a position higher than those of the tab 1b and the bar leads 1f.

Still further, in the lead frame 1 shown in FIG. 7, only a package region which corresponds to one QFN 5 in a multi-cavity frame which is capable of collectively assembling a plurality of QFN 5 is shown. Here, the lead frame 1 may be configured such that a plurality of the above-mentioned package regions are arranged in a row or are arranged in a matrix array of a plurality of columns×a plurality of rows, for example.

Here, a portion indicated by a dashed line in FIG. 7 indicates a mold line 8 after molding.

On the other hand, the semi conductor chip 2 which mounts a semiconductor integrated circuit on the main surface 2b thereof is prepared.

Then, the semiconductor chip 2 on which a plurality of pads 2a are formed and the tab 1b are adhered to each other by means of an adhesive material such as a die bonding material.

That is, the above-mentioned adhesive material is applied to the chip supporting surface 1c of the tab 1b, the semiconductor chip 2 is placed on the chip mounting surface 1c and, thereafter, the die bonding shown in FIG. 8 is performed so as to bond the back surface 2c of the semiconductor chip 2 and the chip supporting surface 1c of the tab 1b.

Thereafter, the wire bonding shown in FIG. 9 is performed. That is, the grounds of the semiconductor chip 2 and the pads 2a of the power source are electrically connected with the bar leads 1f of the lead frame 1 corresponding to them by means of the second wires 4b and, at the same time, the pads 2a for signals of the semiconductor chip 2 and the bonding surfaces 1k of the leads 1a of the lead frame 1 corresponding to the pads 2a are electrically connected to each other through the first wires 4a.

Here, as shown in FIG. 4, the height of the wire bonding portions 1m of respective leads 1a is set greater than the height of the bar leads 1f and hence, the wire bonding is performed by elevating wire loops of the first wires 4a higher than wire loops of the second wires 4b. By setting the wire loops of the first wires 4a higher than the wire loops of the second wires 4b, the occurrence of short-circuiting derived from a contact between both wires can be effectively prevented.

Thereafter, resin sealing of the semiconductor chip 2 is performed by resin molding.

Here, as shown in FIG. 10, a forming mold 9 which is constituted of a pair of molds, that is an upper mold (first mold) 9a and a lower mold (second mold) 9b are used, the lead frame 1 on which the wire bonding shown in FIG. 9 is already performed is arranged on the lower mold 9b by way of a sheet-like film member 7 and, thereafter, the semiconductor chip 2, the first wires 4a, the second wires 4b, the tab 1b and the bar leads 1f are covered with a cavity 9c of the upper mold 9a, and the lead frame 1 is encased by closing or clamping the upper mold 9a and the lower mold 9b.

In closing the upper mold 9a and the lower mold 9b, the suspending leads 1e of the lead frame 1 are sandwiched by the upper mold 9a and the lower mold 9b by way of the film member 7 and the sealing resin is supplied to the inside of the cavity 9c in this state so as to perform resin sealing.

Then, as shown in FIG. 3, the resin molding is performed such that the respective lead exposing portions (portions) 1i of a plurality of leads 1a are exposed at the peripheral portions of the back surface 3a of the sealing body 3 and, at the same time, the suspending lead exposing portions (portions) 11 which constitute the exposed portions of the suspending leads 1e are respectively exposed at four corner portions of the back surface 3a of the sealing body 3.

Here, the molding adopted by this embodiment is a single-face molding since the cavity 9c is formed only in the upper mold 9a of the forming mold 9.

After completion of the resin molding, a lead cutting (individualizing) operation which cuts and separates respective leads 1a and respective suspending leads 1e from the lead frame 1 is performed.

Here, the respective leads 1a and the respective suspending leads 1e are cut slightly outside the mold line 8 which is indicated by the dashed line in FIG. 7 to obtain the structure shown in FIG. 11.

As a result, the QFN 5 having the tab embedding structure shown in FIG. 1 to FIG. 3 is completed.

(Embodiment 2)

Figure 15:
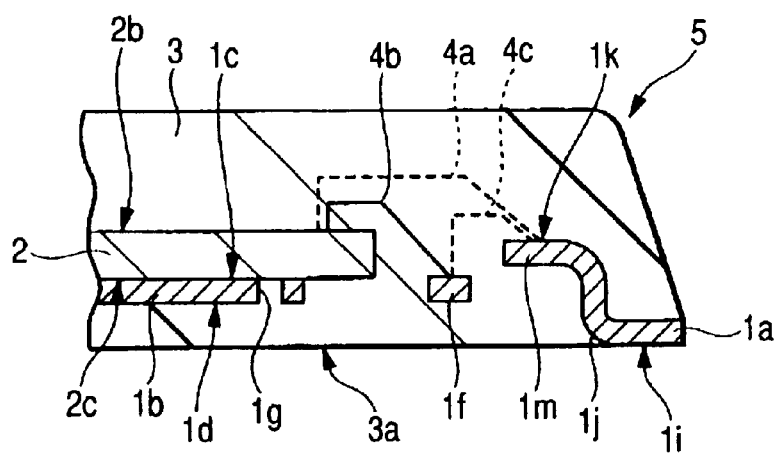
FIG. 15 is a partial cross-sectional view showing one example of a cross-sectional structure of a semiconductor device (QFN) of an embodiment 2 of the present invention by cutting the semiconductor device (QFN) at a C portion shown in FIG. 16.
Figure 16:
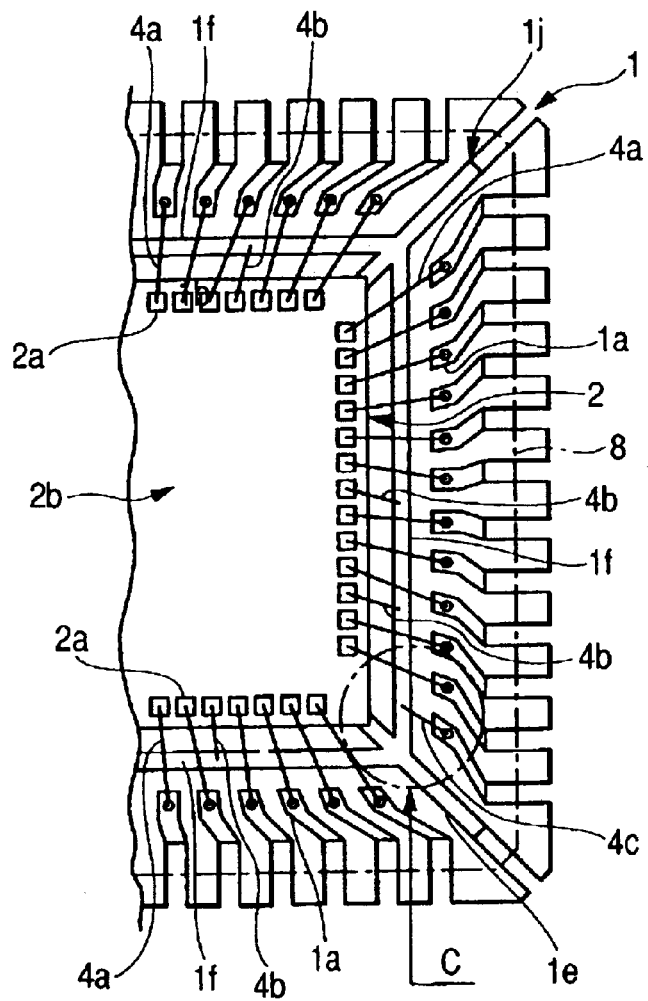
FIG. 16 is a partial plan view showing one example of the structure of the QFN shown in FIG. 15 after wire bonding in assembling of the QFN.
Figure 17:
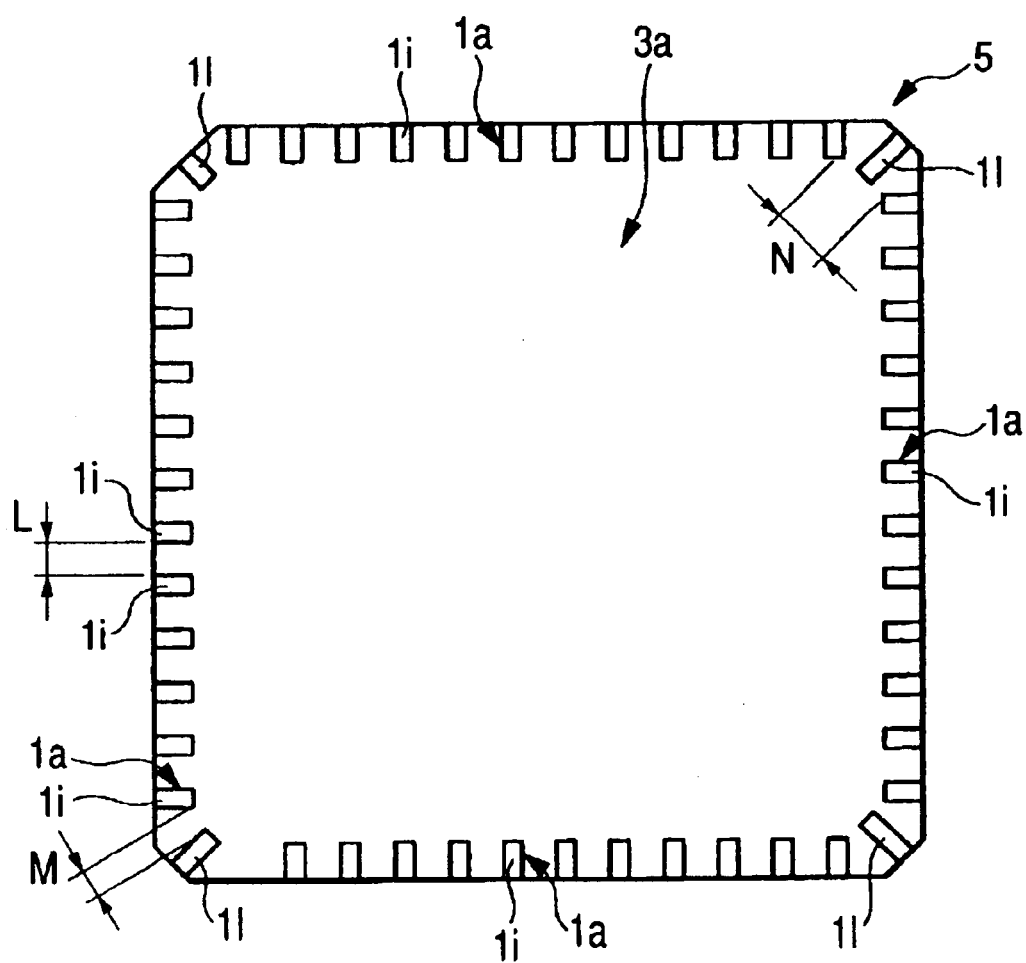
FIG. 17 is a bottom view showing one example of the structure of the QFN shown in FIG. 15.
Figure 18:
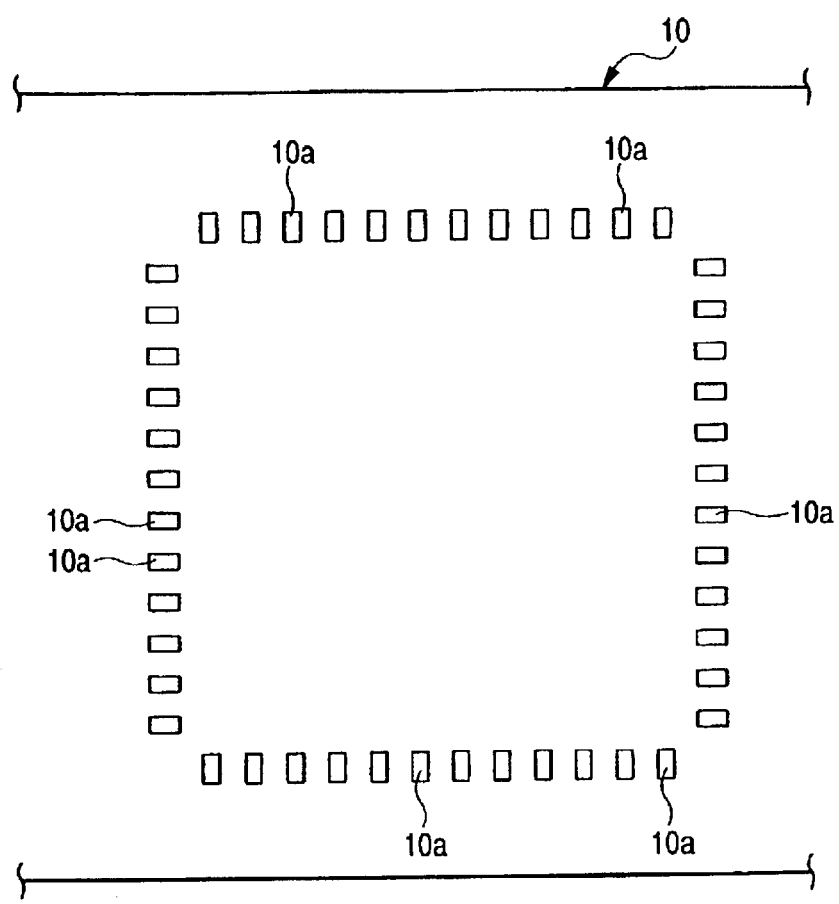
FIG. 18 is a partial plan view showing one example of an arrangement of terminals of a mounting substrate on which the QFN shown in FIG. 15 is mounted.
Figure 19:
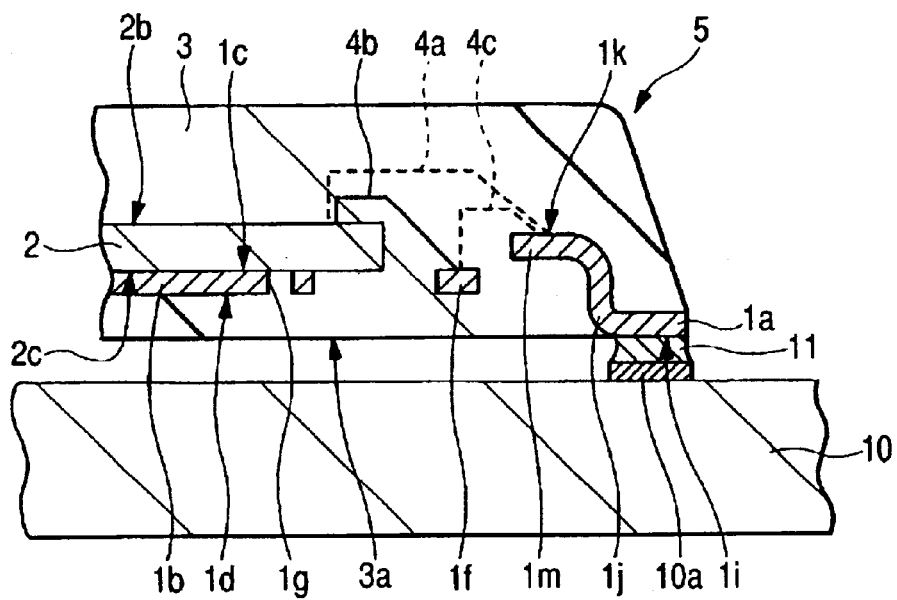
FIG. 19 is a partial cross-sectional view showing one example of a structure for mounting the QFN shown in FIG. 15 on a mounting substrate by cutting the mounting structure at a lead position.
Figure 20:
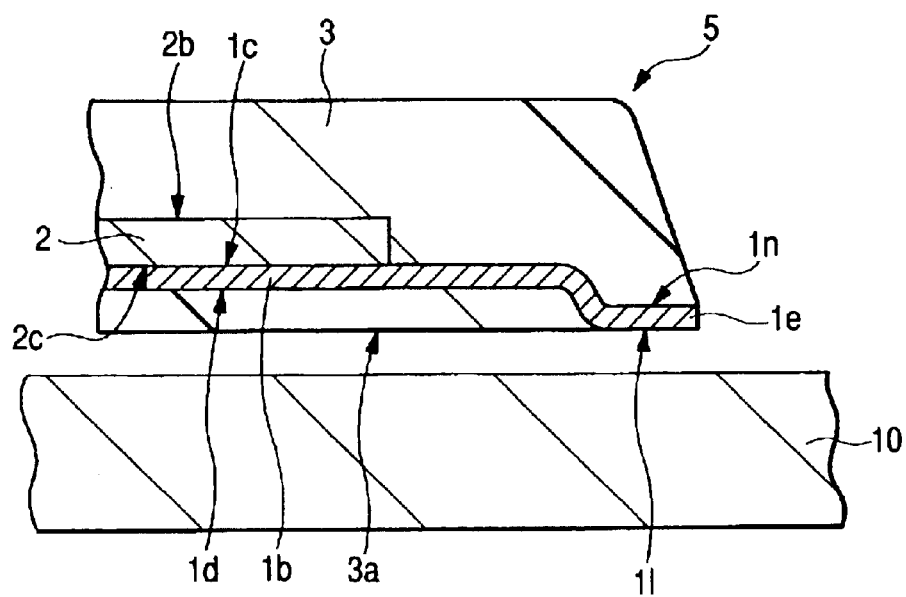
FIG. 20 is a partial cross-sectional view showing one example of a structure for mounting the QFN shown in FIG. 15 on a mounting substrate by cutting the mounting structure at a suspending lead position.

FIG. 15 is a partial cross-sectional view showing one example of a cross-sectional structure of a semiconductor device (QFN) of the embodiment 2 of the present invention by cutting the semiconductor device at a C portion shown in FIG. 16, FIG. 16 is a partial plan view showing one example of the structure of the QFN shown in FIG. 15 after wire bonding in assembling of the QFN, FIG. 17 is a bottom view showing one example of the structure of the QFN shown in FIG. 15, FIG. 18 is a partial plan view showing one example of an arrangement of terminals of a mounting substrate on which the QFN shown in FIG. 15 are mounted, FIG. 19 is a partial cross-sectional view showing one example of a structure for mounting the QFN shown in FIG. 15 on a mounting substrate by cutting the mounting structure at a lead position and FIG. 20 is a partial cross-sectional view showing one example of a structure for mounting the QFN shown in FIG. 15 on a mounting substrate by cutting the mounting structure at a suspending lead position.

The QFN 5 of this embodiment 2 substantially has the same structure as the QFN 5 of the embodiment 1. The constitution which makes the QFN 5 of this embodiment different from the QFN 5 of the embodiment 1 lies in that in a plurality of leads 1a and four suspending leads 1e which are exposed on the back surface 3a of the sealing body 3, with respect to the suspending lead exposing portion 11 which constitutes an exposed portion of the suspending lead 1e and the lead exposing portion 1i which constitutes an exposing portion of the lead 1a, the distance (M) between the lead exposing portion 1i and the suspending lead exposing portion 11 shown in FIG. 3 is set smaller than the distance (L) between the neighboring lead exposing portions 1i and, at the same time, the distance (N) between the leads 1a which are arranged at both sides of the suspending lead exposing portion 11 at the corner portion is set larger than the above-mentioned distance (L).

That is, this embodiment 2 adopts the structure in which on the back surface 3a of the sealing body 3, the relationship of distance (M)<distance (L)<distance (N) is established as shown in FIG. 17 and hence, the suspending lead exposing portions 11 arranged at four corner portions of the sealing body 3 are not used as external terminals.

Also in this case, as shown in FIG. 15 and FIG. 16, each bar lead 1f which constitutes the common lead portion for down bonding extends between the neighboring suspending leads 1e like a bridge and connects these suspending leads 1e out of four suspending leads 1e. Further, the bar lead 1f is arranged between the semiconductor chip 2 and the row of leads 1a and each bar lead 1f is arranged substantially parallel to the row of leads 1a and one side of the semiconductor chip 2.

Due to such a constitution, it is possible to electrically connect the grounds of the semiconductor chip 2 and the pads 2a of the power source with the bar leads 1f by means of the second wires 4b and, at the same time, it is possible to connect the bar leads 1f with respective leads 1a by means of the third wires 4c.

Further, since the suspending lead exposing portions 11 are no more used as external terminals, it is possible to provide the leads 1a in the vicinity of the corner portions such that the leads 1a are disposed close to the suspending leads 1e and hence, the distance (M) shown in FIG. 17 can be narrowed.

Accordingly, the QFN 5 of this embodiment 2 can increase the number of leads 1a arranged along one side. For example, as shown in FIG. 16 and FIG. 17, the number of leads 1a along one side can be set to 12 pieces and hence, the number of leads 1a can be increased by two pieces for each side compared to the QFN 5 of the embodiment 1.

Here, since the suspending lead exposing portions 11 are no more used as external terminals, in the arrangement of the substrate-side terminals 10a of the mounting substrate 10 shown in FIG. 18 on which this QFN 5 is mounted, the substrate-side terminals 10a are not provided at four corner portions of the mounting substrate 10.

Accordingly, when the QFN 5 is mounted on the mounting substrate 10, the leads 1a are connected by soldering by way of solder connecting portions 11 as shown in FIG. 19, while the suspending lead exposing portions 11 are not subjected to solder bonding as shown in FIG. 20.

Here, the distance (N) between the leads 1a which are arranged close to each other at both sides of the suspending lead exposing portion 11 exposed at the corner portion can be set larger than the distance (L) between the neighboring lead exposing portions 1i at a plurality of leads 1a arranged along each side of the back surface 3a. Due to such a constitution, in a mounting step for connecting the leads 1a and the substrate-side terminals 10a by melting solder, it is possible to obtain an advantageous effect that the occurrence of failure due to leaking of solder can be prevented in advance.

In the QFN 5 of this embodiment 2, the suspending leads 1e are not used as the external terminals and hence, by connecting the bar lead 1f and a desired lead 1a using the third wire 4c as shown in a C portion of FIG. 16, it is possible to transmit the potential of the grounds of the bar leads 1f which constitutes the common lead portions and the power source to the leads 1a connected to the grounds and the power source by way of the third wires 4c. By connecting these leads 1a to the mounting substrate 10 by the ground connection, it is also possible to strengthen the grounds and the power source also with respect to the QFN 5 having a small tab structure of this embodiment 2.

Further, since it is possible to connect a plurality of grounds of the semiconductor chip 2 and the pads 2a of the power source to one lead 1a through the bar lead 1f, it is possible to stabilize the ground/power source potential without largely decreasing the number of pins for signals whereby the enhancement of electric characteristics can be obtained also with respect to the QFN 5 having a large number of pins.

(Embodiment 3)

Figure 21:
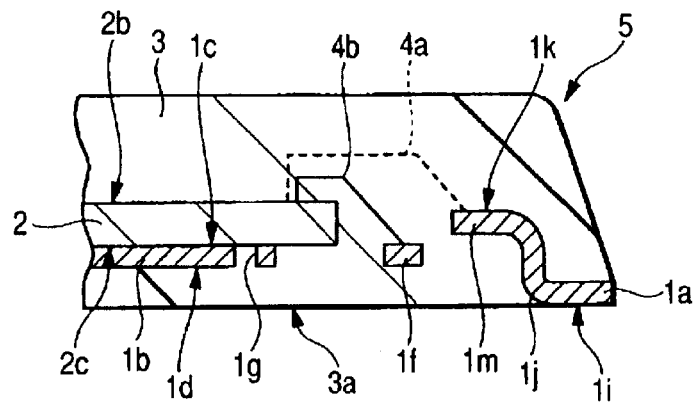
FIG. 21 is a partial cross-sectional view showing one example of a cross-sectional structure of a semiconductor device (QFN) of an embodiment 3 of the present invention by cutting the semiconductor device at a D portion shown in FIG. 22.
Figure 22:
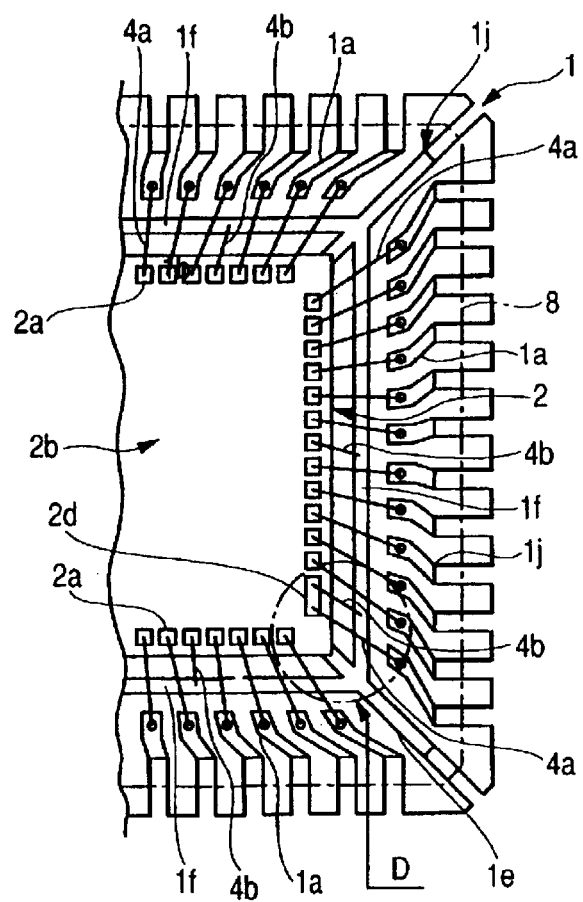
FIG. 22 is a partial plan view showing one example of the structure after wire bonding in assembling of the QFN shown in FIG. 21.
Figure 23:
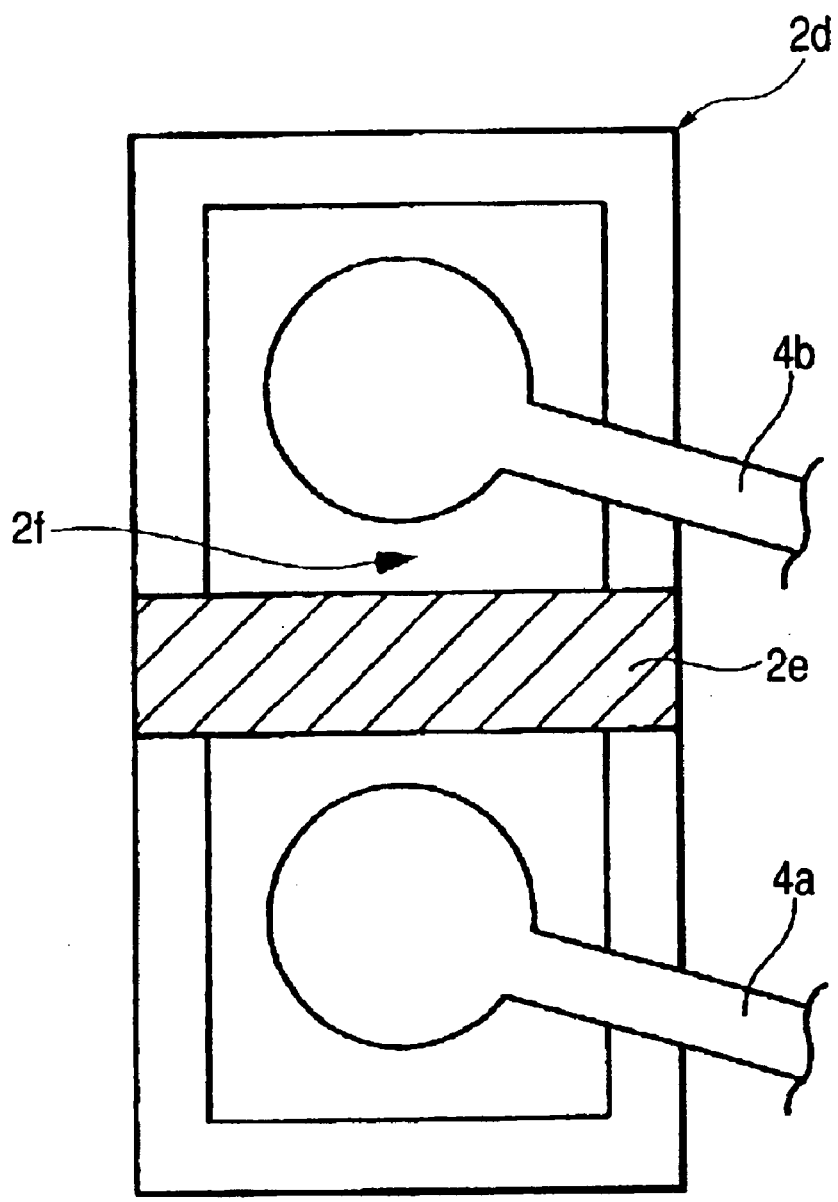
FIG. 23 is an enlarged partial plan view showing one example of a structure of a double-sized pad of a semiconductor chip shown in FIG. 22.
Figure 24:
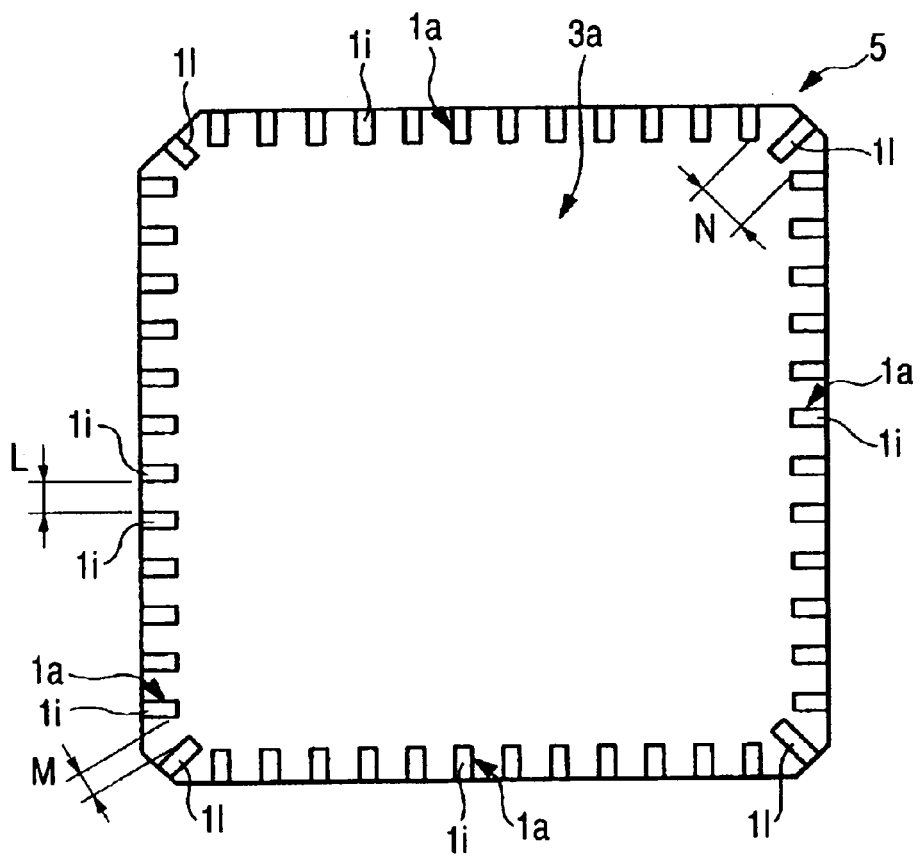
FIG. 24 is a bottom view showing one example of the structure of the QFN shown in FIG. 21.
Figure 25:
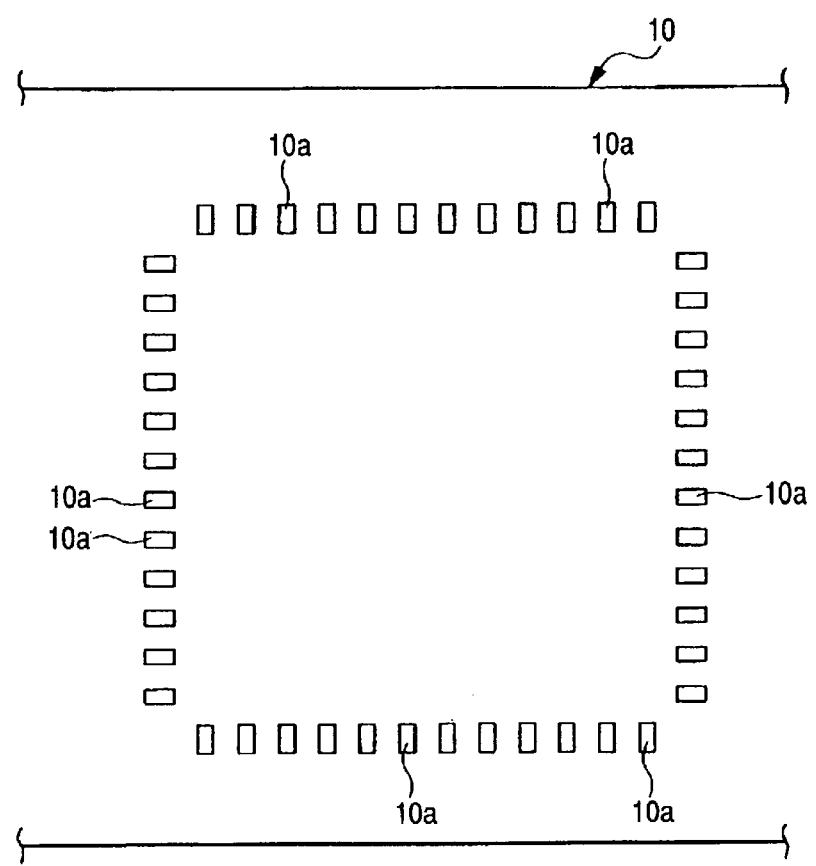
FIG. 25 is a partial plan view showing one example of a terminal arrangement of a mounting substrate on which the QFN shown in FIG. 21 is mounted.
Figure 26:
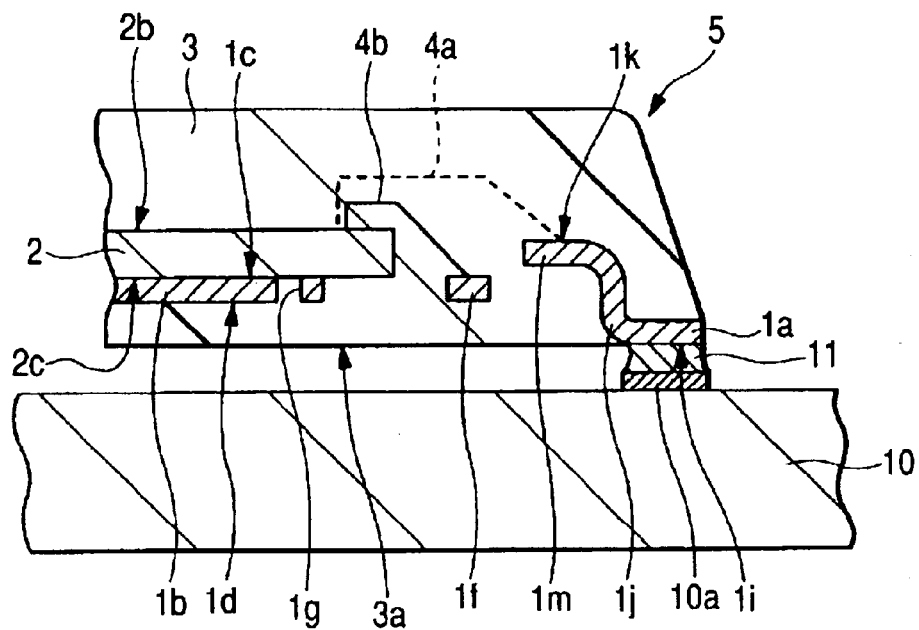
FIG. 26 is a partial cross-sectional view showing one example of a structure for mounting the QFN shown in FIG. 21 to the mounting substrate by cutting the mounting structure at a lead position.
Figure 27:
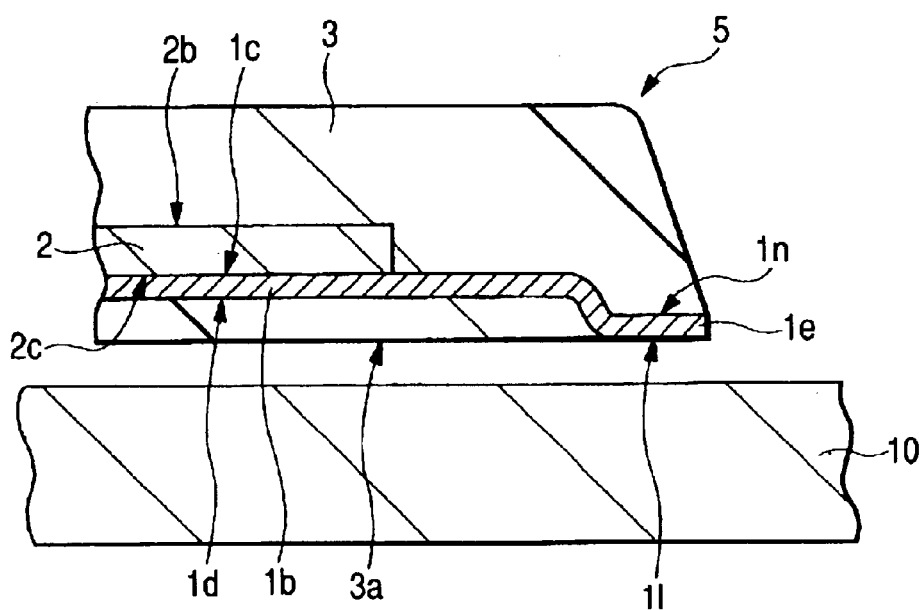
FIG. 27 is a partial cross-sectional view showing one example of a structure for mounting the QFN shown in FIG. 21 to the mounting substrate by cutting the mounting structure at a suspending lead position.

FIG. 21 is a partial cross-sectional view showing one example of a cross-sectional structure of a semiconductor device (QFN) of the embodiment 3 of the present invention by cutting the semiconductor device at a D portion shown in FIG. 22, FIG. 22 is a partial plan view showing one example of the structure after wire bonding in assembling of the QFN shown in FIG. 21, FIG. 23 is an enlarged partial cross-sectional view showing one example of a double-sized pad of a semiconductor chip shown in FIG. 22, FIG. 24 is a bottom view showing one example of the structure of the QFN shown in FIG. 21, FIG. 25 is a partial plan view showing one example of a terminal arrangement of a mounting substrate on which the QFN shown in FIG. 21 is mounted, FIG. 26 is a partial cross-sectional view showing one example of a structure for mounting the QFN shown in FIG. 21 to the mounting substrate by cutting the mounting structure at a lead position and FIG. 27 is a partial cross-sectional view showing one example of a structure for mounting the QFN shown in FIG. 21 to the mounting substrate by cutting the mounting structure at a suspending lead position.

The QFN of the embodiment 3 substantially has the same structure as the structure of the QFN 5 of the second embodiment. In this embodiment, the distance (M) between the lead exposing portion 1i and the suspending lead exposing portion 11 shown in FIG. 3 is set smaller than the distance (L) between the neighboring lead exposing portions 1i and, at the same time, the distance (N) between the leads 1a which are arranged at both sides of the suspending lead exposing portion 11 at each corner portion is set larger than the above-mentioned distance (L).

That is, the relationship of distance (M)<distance (L)<distance (N) is established as shown in FIG. 24 and hence, in the same manner as the QFN 5 of the embodiment 2, the suspending lead exposing portions 11 arranged at four corner portions of the sealing body 3 are not used as external terminals.

Accordingly, in the QFN 5 of the embodiment 3, the bar leads 1f and the leads 1a are not connected by the third wires 4c and, instead, as indicated by a D portion in FIG. 22, a double-sized pad 2d consisting of two electrodes which are connected to low resistant lines 2f is provided (see FIG. 2 and FIG. 3) and the first wire 4a and the second wire 4b are connected to the double-sized pad 2d.

This double-sized pad 2d is, as shown in FIG. 23, formed by connecting two pads 2a by the low resistant line 2f which constitutes a relay line having a width larger than the diameter of balls formed at the time of connecting the first wire 4a and the second wire 4b. Due to such a constitution, it is possible to connect between two electrodes by lowering the resistant value of the relay line. In this case, by covering the low resistant line 2f with an insulation film 2e, two pads 2a are formed in appearance so that it is unnecessary to increase a master pattern at the time of forming a surface protective film of the semiconductor chip 2.

Also in this embodiment 3, as shown in FIG. 21 and FIG. 22, each bar lead 1f which constitutes the common lead portion for down bonding extends between the neighboring suspending leads 1e like a bridge and connects these suspending leads 1e out of four suspending leads 1e. Further, each bar lead 1f is arranged between the semiconductor chip 2 and the row of the leads 1a and is disposed substantially parallel to the row of leads 1a and one side of the semiconductor chip 2.

Accordingly, the ground of the semiconductor chip 2 and the double-sized pad 2d of the power source can be electrically connected with the bar leads 1f using the first wires 4a and the second wires 4b.

In this manner, according to the QFN 5 of this embodiment 3, the semiconductor chip 2 on which the double-sized pad 2d incorporating the low resistant line 2f is formed is mounted on the QFN, a desired lead 1a is connected to one electrode of the double-sized pad 2d by way of the first wire 4a, the bar lead 1f is connected to another electrode by way of the second wire 4b, and a plurality of grounds of the semiconductor chip 2 and the pads 2a of the power source are connected to one lead 1a by way of the bar lead 1f and the double-sized pad 2d.

In this manner, by providing the ground connection of the lead 1a to the mounting substrate 10, also in the QFN 5 having a small tab structure of this embodiment 3, it is possible to strengthen the ground and the power source and, at the same time, it is possible to connect a plurality of grounds of the semiconductor chip 2 and the pads 2a of the power source to one lead 1a by way of the bar lead 1f and the double-sized pad 2d and hence, the ground/power source potential can be made stable without reducing the number of pins for signals considerably.

As a result, even when the QFN 5 includes a large number of pins, it is possible to enhance the electric characteristics.

Further, since the suspending lead exposing portions 11 are no more used as external terminals, it is possible to provide the leads 1a in the vicinity of the corner portions such that the leads 1a are disposed close to the suspending leads 1e and hence, in the same manner as the embodiment 2, the distance (M) shown in FIG. 24 can be narrowed.

Accordingly, the QFN 5 of this embodiment 3 can increase the number of leads 1a arranged along one side. For example, as shown in FIG. 22 and FIG. 24, the number of leads 1a along one side can be set to 12 pieces and hence, the number of leads 1a can be increased by two pieces for each side compared to the QFN 5 of the embodiment 1.

Here, since the suspending lead exposing portions 11 are no more used as external terminals in the same manner as the embodiment 2, in the arrangement of the substrate-side terminals 10a of the mounting substrate 10 shown in FIG. 25 on which this QFN 5 is mounted, the substrate-side terminals 10a are not provided at four corner portions of the mounting substrate 10.

Accordingly, when the QFN 5 is mounted on the mounting substrate 10, the leads 1a are connected by soldering by way of solder connecting portions 11 as shown in FIG. 26, while the suspending lead exposing portions 11 are not subjected to solder connection as shown in FIG. 27.

(Embodiment 4)

Figure 28:
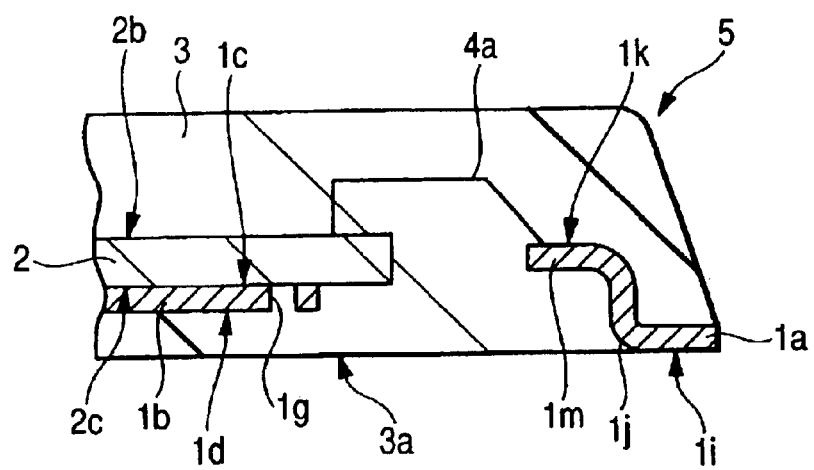
FIG. 28 is a partial cross-sectional view showing one example of a cross-sectional structure of a semiconductor device (QFN) of an embodiment 4 of the present invention by cutting the semiconductor device along a line E—E shown in FIG. 30.
Figure 29:
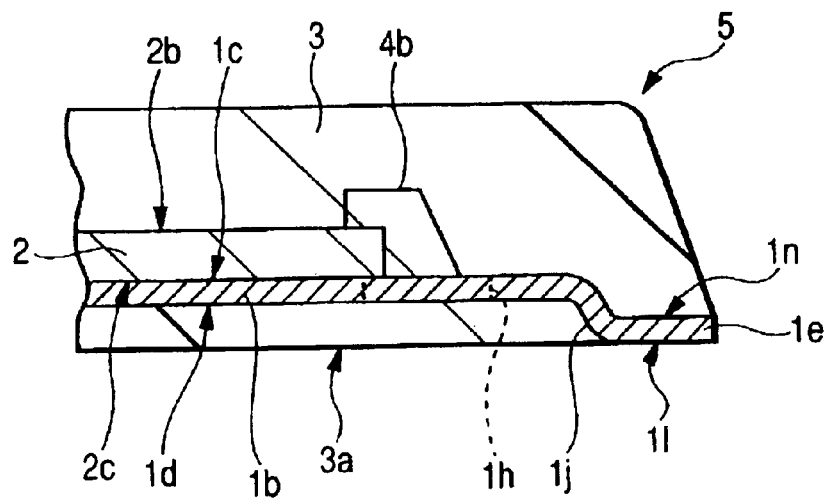
FIG. 29 is a partial cross-sectional view showing one example of the cross-sectional structure of the QFN shown in FIG. 28 by cutting the QFN along a line F—F shown in FIG. 30.
Figure 30:
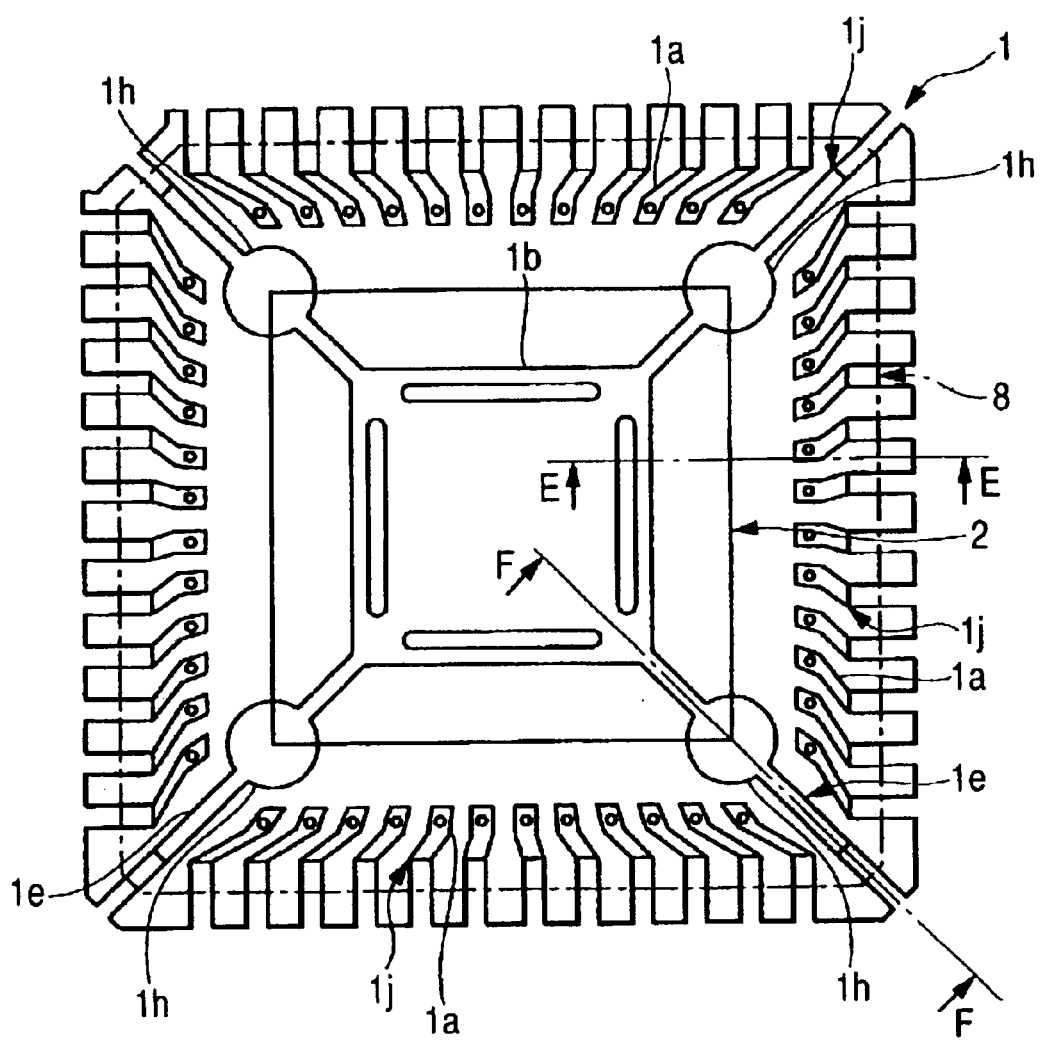
FIG. 30 is a partial plan view showing one example of the structure after die bonding in assembling of the QFN shown in FIG. 28.

FIG. 28 is a partial cross-sectional view showing one example of a cross-sectional structure of a semiconductor device (QFN) of the embodiment 4 of the present invention by cutting the semiconductor device along a line E—E shown in FIG. 30, FIG. 29 is a partial cross-sectional view showing one example of the cross-sectional structure of the QFN shown in FIG. 28 by cutting the QFN along a line F—F shown in FIG. 30 and FIG. 30 is a partial plan view showing one example of the structure after die bonding in assembling of the QFN shown in FIG. 28.

In the QFN 5 of this embodiment 4 shown in FIG. 28 and FIG. 29, the common lead portions for down bonding are not formed in a bar shape but are formed of islands 1h which are connected only to respective suspending leads 1e.

That is, as shown in FIG. 30, the islands 1h which have at least portions thereof arranged at outside the semiconductor chip 2 are provided to the respective suspending leads 1e. Here, the islands 1h have a circular shape. However, the shape of the islands 1h is not particularly limited and may be a polygonal shape or an elliptical shape provided that the down bonding is possible.

Further, it is not always necessary to form the islands 1h on all suspending leads 1e and the islands 1h may be formed only on specific suspending leads 1e.

As shown in FIG. 28, the respective pads 2a and the leads 1a which correspond to respective pads 2a are connected to each other by the first wires 4a and, at the same time, as shown in FIG. 29, the grounds and the pads 2a of the power source or the like are connected to the islands 1h by the second wires 4b. Due to such a constitution, it is possible to make the grounds and the power source have the common potential by way of the tabs 1b.

Accordingly, in the QFN 5 of the embodiment 4, by performing the down bonding of the grounds and the pads 2a of the power source to the islands 1h in the vicinity thereof, it is possible to make a plurality of grounds of the semiconductor chip 2 and the pads 2a of the power source in common by way of the islands 1h and the tabs 1b.

Further, by connecting another one pad 2a of the ground and the power source with one lead 1a and by providing the ground connection of the lead 1a to the mounting substrate 10 (see FIG. 25), also in the QFN 5 having a small tab structure of this embodiment 4, it is possible to strengthen the ground and the power source and, at the same time, it is possible to connect a plurality of grounds of the semiconductor chip 2 and the pads 2a of the power source to one lead 1a by way of the islands 1h and the tab 1b and hence, the ground/power source potential can be made stable without reducing the number of pins for signals considerably.

As a result, even when the QFN 5 includes a large number of pins, it is possible to enhance the electric characteristics.

The invention made by the inventors has been specifically explained based on the embodiments of the present invention. However, it is needless to say that the present invention is not limited to the above-mentioned embodiments of the present invention and various modifications can be made without departing from the scope of the gist of the present invention.

For example, in the above-mentioned embodiments 1 to 3, the case in which four pieces of bar leads 1f are formed corresponding to all four sides of the semiconductor chip 2. However, it is not always necessary to provide the bar leads 1f corresponding to all four sides of the semiconductor chip 2 and it is sufficient that the bar leads 1f are provided corresponding to at least one side.

To briefly recapitulate the advantageous effects obtained by the typical inventions out of the inventions disclosed in this specification, they are as follows.

According to the semiconductor device of the present invention, the common lead portions which are connected to the suspending leads and have at least portions thereof arranged outside the semiconductor chip are provided, the wire bonding is applied to the common lead portions, and the distance between the suspending lead exposing portion and the lead exposing portion close to the suspending lead exposing portion is equal to or more than the distance between the neighboring lead exposing portions. Accordingly, it is possible to use the suspending leads as the external terminals and hence, it is possible to ensure the stable ground/power source potential without decreasing the number of pins for signals.

What is claimed is:

1. A semiconductor device comprising:
   a semiconductor chip which has a semiconductor die and a plurality of electrodes;
   a plurality of leads which are arranged around the semiconductor chip,
   a tab which has a size smaller than a size of a main surface of the semiconductor chip and is bonded to a back surface of the semiconductor chip;
   a plurality of suspending leads which are connected to the tab and to which bent portions are formed so as to form stepped portions with respect to the tab;
   common lead portions which are connected to the suspending leads and have at least portions thereof arranged outside the semiconductor chip;
   a plurality of first wires which electrically connect a plurality of electrodes of the semiconductor chip with a plurality of leads respectively;
   second wires which electrically connect electrodes of the semiconductor chip with the common lead portions; and
   a sealing body which seals the semiconductor chip, the first and the second wires, the tab and the common lead portions using resin,
   wherein a plurality of leads and a plurality of suspending leads have respective portions thereof exposed to a mounting surface of the sealing body, and
   wherein a distance between a suspending lead exposing portion and a lead exposing portion disposed close to the suspending lead exposing portion on the mounting surface is set to a value equal to or more than a distance between the neighboring lead exposing portions on the mounting surface.

2. A semiconductor device according to claim 1, wherein four suspending leads which extend toward corner portions of the sealing body are formed, each common lead portion connects the neighboring suspending leads and is arranged between the semiconductor chip and a row of the leads.

3. A semiconductor device according to claim 1, wherein the common lead portions are arranged at a height equal to a height of the tab and wire bonding portions of the leads are arranged at a position further from a mounting surface of the sealing body than the common lead portions.

4. A semiconductor device according to claim 1, wherein with respect to a plurality of suspending leads, the common lead portions which are connected only to respective suspending leads are provided.

5. A semiconductor device comprising:
   a semiconductor chip which has a semiconductor die and a plurality of electrodes;
   a plurality of leads which are arranged around the semiconductor chip;
   a tab which has a size smaller than a size of a main surface of the semiconductor chip and is bonded to a back surface of the semiconductor chip;
   a plurality of suspending leads which are connected to the tab and to which bent portions are formed so as to form stepped portions with respect to the tab;
   common lead portions which are connected to the suspending leads and have at least portions thereof arranged outside the semiconductor chip;
   a plurality of first wires which electrically connect a plurality of electrodes of the semiconductor chip with a plurality of leads respectively;
   second wires which electrically connect electrodes of the semiconductor chip with the common lead portions;
   third wires which electrically connect the common lead portions and the leads; and
   a sealing body which seals the semiconductor chip, the first, the second and the third wires, the tab and the common lead portions using resin,
   wherein a plurality of leads and a plurality of suspending leads have respective portions thereof exposed to a mounting surface of the sealing body, and
   wherein a distance between a suspending lead exposing portion and a lead exposing portion disposed close to the suspending lead exposing portion on the mounting surface is set to a value smaller than a distance between the neighboring lead exposing portions on the mounting surface.

6. A semiconductor device according to claim 5, wherein four suspending leads which extend toward corner portions of the sealing body are formed, each common lead portion connects the neighboring suspending leads and is arranged between the semiconductor chip and a row of the leads.

7. A semiconductor device comprising:
   a semiconductor chip which has a semiconductor die and a plurality of electrodes;
   a plurality of leads which are arranged around the semiconductor chip;
   a tab which has a size smaller than a size of a main surface of the semiconductor chip and is bonded to a back surface of the semiconductor chip;
   a plurality of suspending leads which are connected to the tab and to which bent portions are formed so as to form stepped portions with respect to the tab;
   common lead portions which are connected to the suspending leads and have at least portions thereof arranged outside the semiconductor chip;
   a plurality of first wires which electrically connect a plurality of electrodes of the semiconductor chip with a plurality of leads respectively;
   second wires which electrically connect some of a plurality of electrodes to which the plurality of first wires are respectively connected with the common lead portions; and
   a sealing body which seals the semiconductor chip, the first and the second wires, the tab and the common lead portions using resin, wherein a plurality of leads and a plurality of suspending leads have respective portions thereof exposed to a mounting surface of the sealing body, and wherein a distance between a suspending lead exposing portion and a lead exposing portion disposed close to the suspending lead exposing portion on the mounting surface is set to a value smaller than a distance between the neighboring lead exposing portions on the mounting surface.

8. A semiconductor device according to claim 7, wherein four suspending leads which extend toward corner portions of the sealing body are formed, each common lead portion connects the neighboring suspending leads and is arranged between the semiconductor chip and a row of the leads.

9. A semiconductor device according to claim 7, wherein the common lead portions are arranged at a height equal to a height of the tab and wire bonding portions of the leads are arranged at a position further from a mounting surface of the sealing body than the common lead portions.

10. A semiconductor device according to claim 7, wherein the electrodes of the semiconductor chip to which both of the first wires and the second wires are connected are connected by relay lines having a width wider than a ball diameter of distal ends of the wires when the respective wires are connected thus forming a single electrode.

* * * * *